(12) United States Patent
Li et al.

(10) Patent No.: US 12,706,602 B2
(45) Date of Patent: Aug. 11, 2026

(54) METHODS AND APPARATUS TO CONTROL A SLEW RATE OF DRIVER CIRCUITRY

(71) Applicant: Texas Instruments Incorporated, Dallas, TX (US)

(72) Inventors: Qunying Li, Allen, TX (US); Lester Boampong, Dallas, TX (US); Lawrence Cotton, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/811,418

(22) Filed: Aug. 21, 2024

(65) Prior Publication Data

US 2025/0350277 A1 Nov. 13, 2025

Related U.S. Application Data

(60) Provisional application No. 63/645,263, filed on May 10, 2024.

(51) Int. Cl.
*H03K 17/16* (2006.01)
*H03K 17/081* (2006.01)

(52) U.S. Cl.
CPC ..... *H03K 17/163* (2013.01); *H03K 17/08104* (2013.01); *H03K 2217/0063* (2013.01); *H03K 2217/0072* (2013.01)

(58) Field of Classification Search
CPC ........... H03K 17/163; H03K 17/08104; H03K 2217/0063; H03K 2217/0072
USPC .......................................................... 327/170
See application file for complete search history.

(56) References Cited

U.S. PATENT DOCUMENTS 8,542,037 B2 * 9/2013 Choy .................... B06B 1/0215 326/82
11,190,173 B2 * 11/2021 Jiang .................... H03K 17/166
2010/0244907 A1 * 9/2010 Gagne .............. H03K 19/00361 327/170

(Continued)

OTHER PUBLICATIONS

Shin et al., "A Slew Rate-Controlled Output Driver having a Constant Transition Time over the Variations of Process, Voltage and Temperature," IEEE 2005 Custom Integrated Circuits Conference, 2005, 4 pages.

*Primary Examiner* — Menatoallah Youssef
*Assistant Examiner* — Colleen J O Toole
(74) *Attorney, Agent, or Firm* — Xianghui Huang; Frank D. Cimino

(57) ABSTRACT

An example apparatus includes: current source circuitry having a first terminal and a second terminal; current sink circuitry having a first terminal and a second terminal; a first transistor having a first terminal, a second terminal, and a control terminal, the first terminal of the first transistor coupled to the first terminal of the current source circuitry; a second transistor having a first terminal, a second terminal, and a control terminal, the first terminal of the second transistor coupled to the first terminal of the current sink circuitry; and a capacitor having a first terminal and a second terminal, the first terminal of the capacitor coupled to the second terminal of the first transistor and the second terminal of the second transistor, the second terminal of the capacitor coupled to the second terminal of the current source circuitry, and the second terminal of the current sink circuitry.

21 Claims, 12 Drawing Sheets

(56) References Cited

U.S. PATENT DOCUMENTS

2015/0084694 A1* 3/2015 Lee ........................ H03F 1/483
327/170
2015/0311893 A1* 10/2015 Jang .................. H03K 19/0185
327/170

* cited by examiner

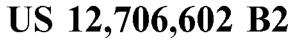
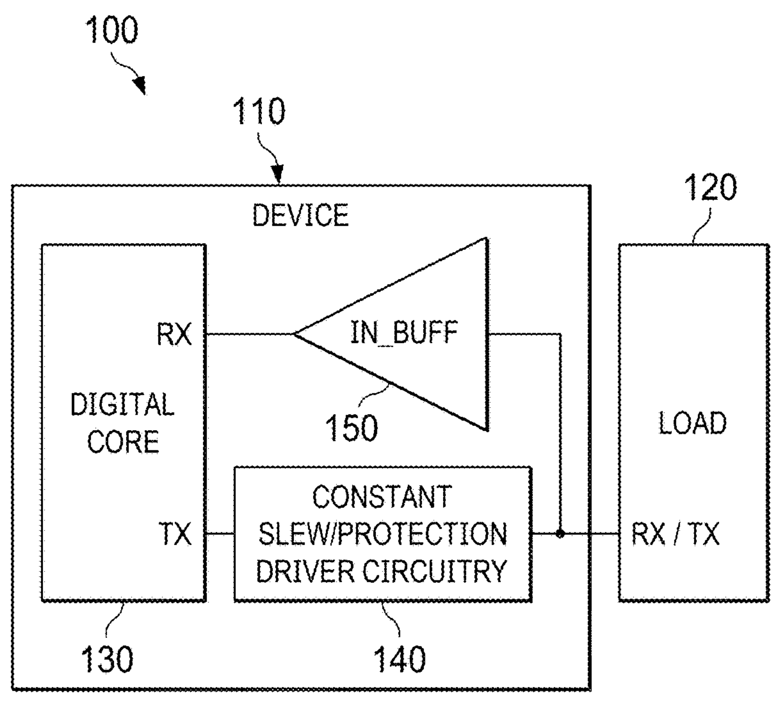
FIG. 1
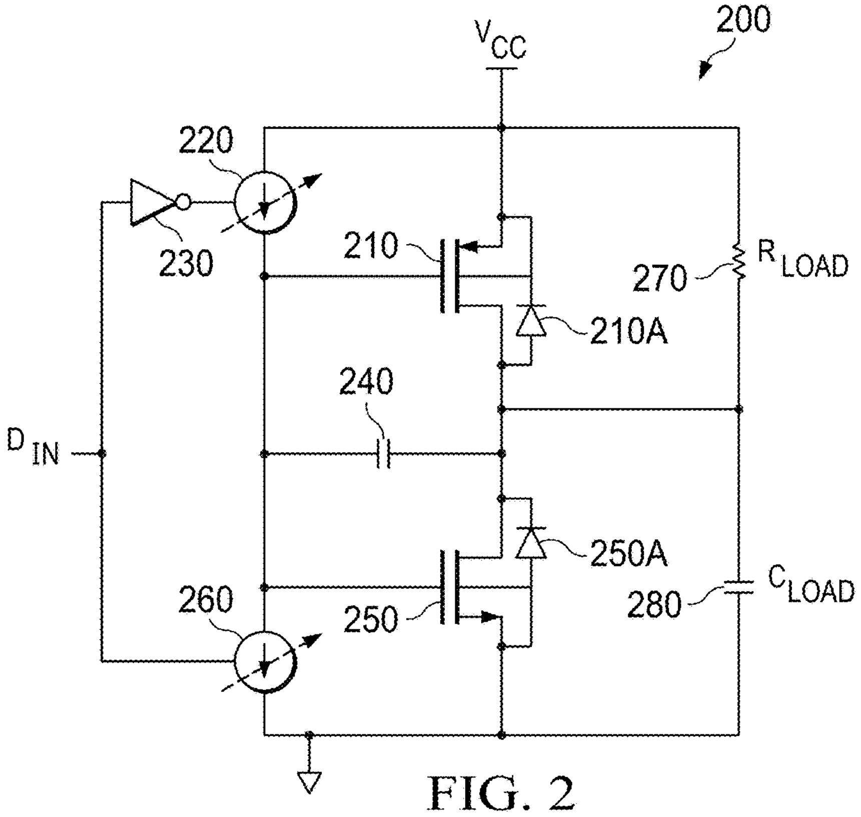
FIG. 2

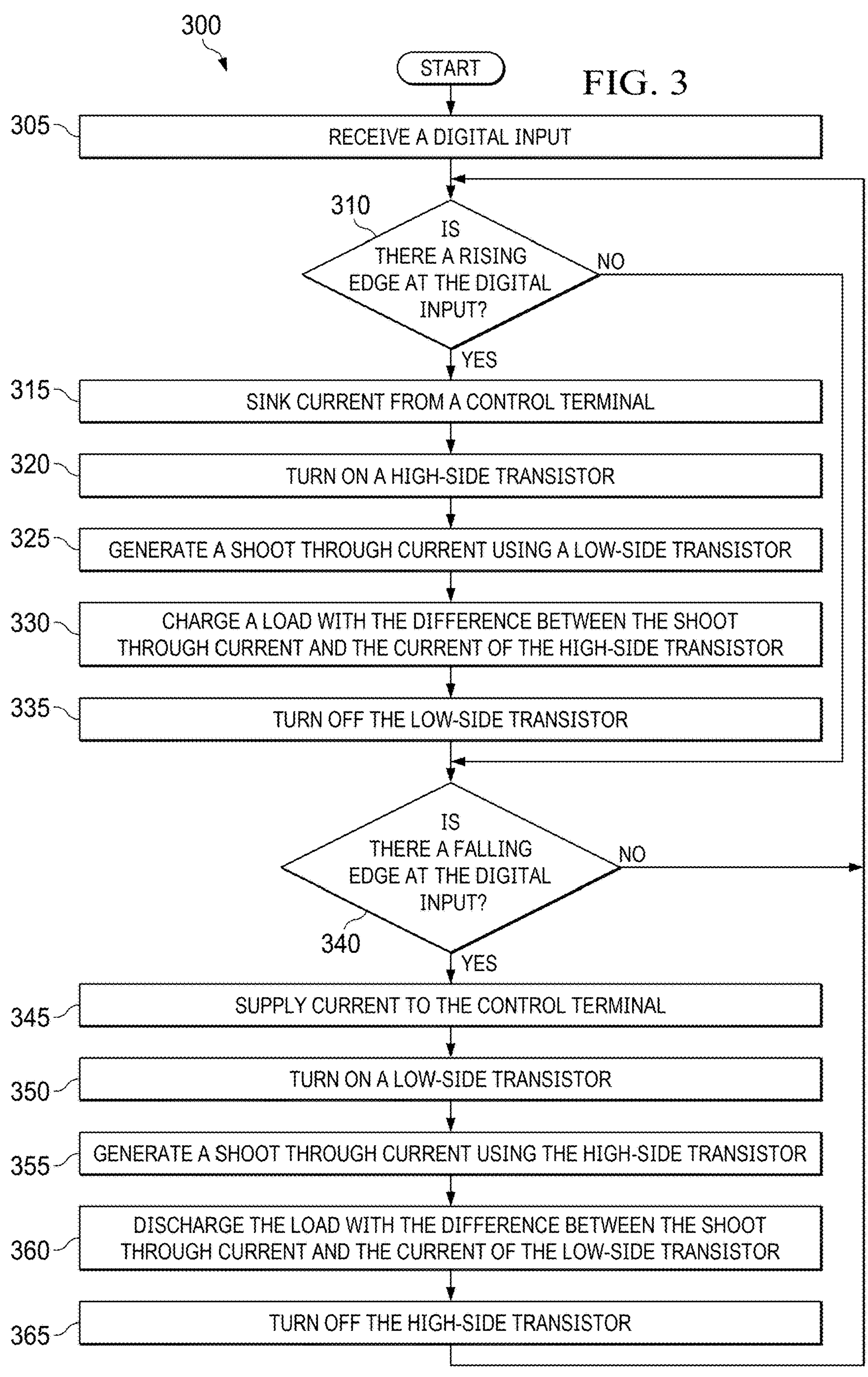
300
START
FIG. 3
305
RECEIVE A DIGITAL INPUT
310
IS THERE A RISING EDGE AT THE DIGITAL INPUT?
NO
YES
315
SINK CURRENT FROM A CONTROL TERMINAL
320
TURN ON A HIGH-SIDE TRANSISTOR
325
GENERATE A SHOOT THROUGH CURRENT USING A LOW-SIDE TRANSISTOR
330
CHARGE A LOAD WITH THE DIFFERENCE BETWEEN THE SHOOT THROUGH CURRENT AND THE CURRENT OF THE HIGH-SIDE TRANSISTOR
335
TURN OFF THE LOW-SIDE TRANSISTOR
IS THERE A FALLING EDGE AT THE DIGITAL INPUT?
NO
340
YES
345
SUPPLY CURRENT TO THE CONTROL TERMINAL
350
TURN ON A LOW-SIDE TRANSISTOR
355
GENERATE A SHOOT THROUGH CURRENT USING THE HIGH-SIDE TRANSISTOR
360
DISCHARGE THE LOAD WITH THE DIFFERENCE BETWEEN THE SHOOT THROUGH CURRENT AND THE CURRENT OF THE LOW-SIDE TRANSISTOR
365
TURN OFF THE HIGH-SIDE TRANSISTOR

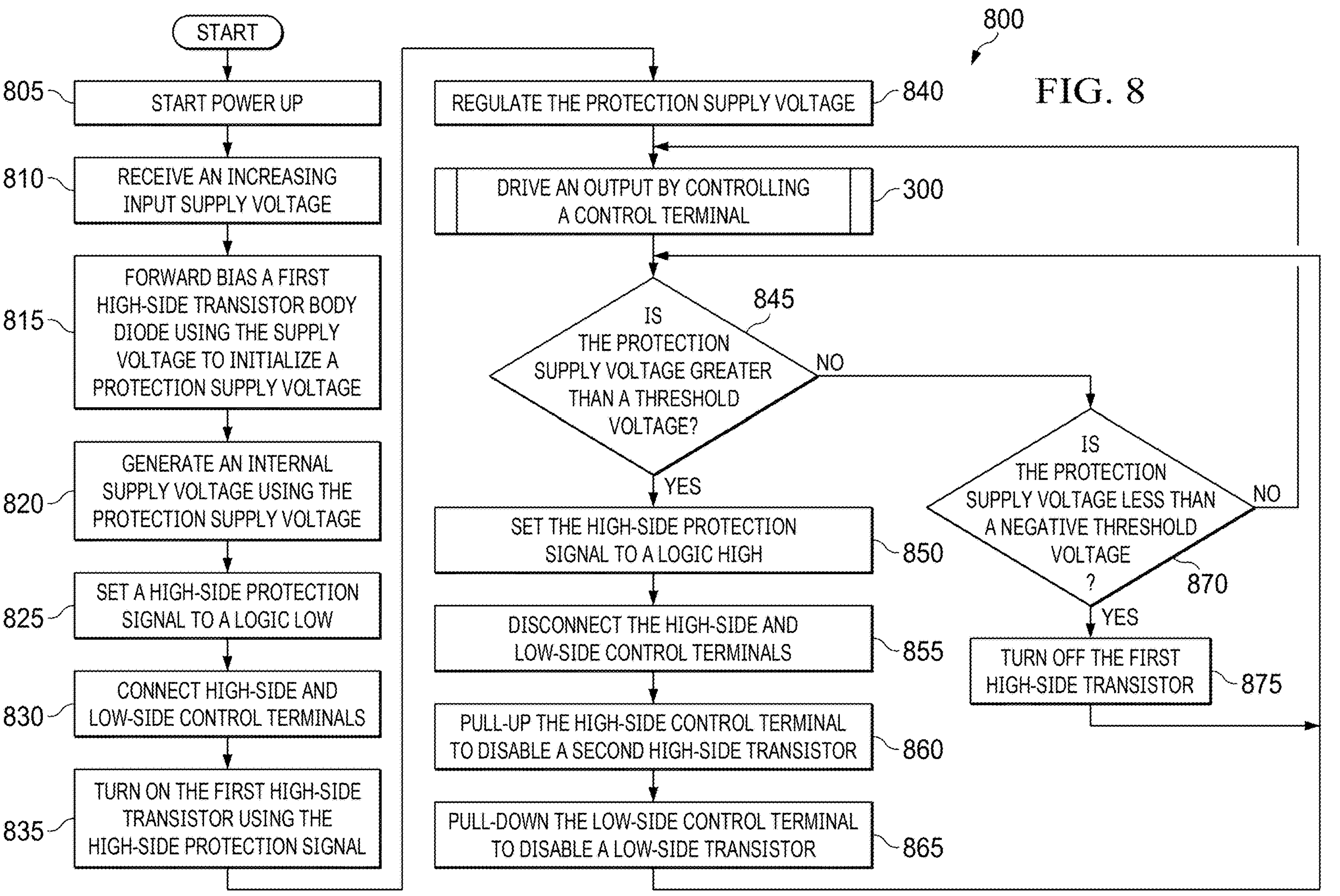
800
FIG. 8
START
805 START POWER UP
810 RECEIVE AN INCREASING INPUT SUPPLY VOLTAGE
815 FORWARD BIAS A FIRST HIGH-SIDE TRANSISTOR BODY DIODE USING THE SUPPLY VOLTAGE TO INITIALIZE A PROTECTION SUPPLY VOLTAGE
820 GENERATE AN INTERNAL SUPPLY VOLTAGE USING THE PROTECTION SUPPLY VOLTAGE
825 SET A HIGH-SIDE PROTECTION SIGNAL TO A LOGIC LOW
830 CONNECT HIGH-SIDE AND LOW-SIDE CONTROL TERMINALS
835 TURN ON THE FIRST HIGH-SIDE TRANSISTOR USING THE HIGH-SIDE PROTECTION SIGNAL
840 REGULATE THE PROTECTION SUPPLY VOLTAGE
300 DRIVE AN OUTPUT BY CONTROLLING A CONTROL TERMINAL
845 IS THE PROTECTION SUPPLY VOLTAGE GREATER THAN A THRESHOLD VOLTAGE?
NO
YES
850 SET THE HIGH-SIDE PROTECTION SIGNAL TO A LOGIC HIGH
855 DISCONNECT THE HIGH-SIDE AND LOW-SIDE CONTROL TERMINALS
860 PULL-UP THE HIGH-SIDE CONTROL TERMINAL TO DISABLE A SECOND HIGH-SIDE TRANSISTOR
865 PULL-DOWN THE LOW-SIDE CONTROL TERMINAL TO DISABLE A LOW-SIDE TRANSISTOR
870 IS THE PROTECTION SUPPLY VOLTAGE LESS THAN A NEGATIVE THRESHOLD VOLTAGE ?
NO
YES
875 TURN OFF THE FIRST HIGH-SIDE TRANSISTOR

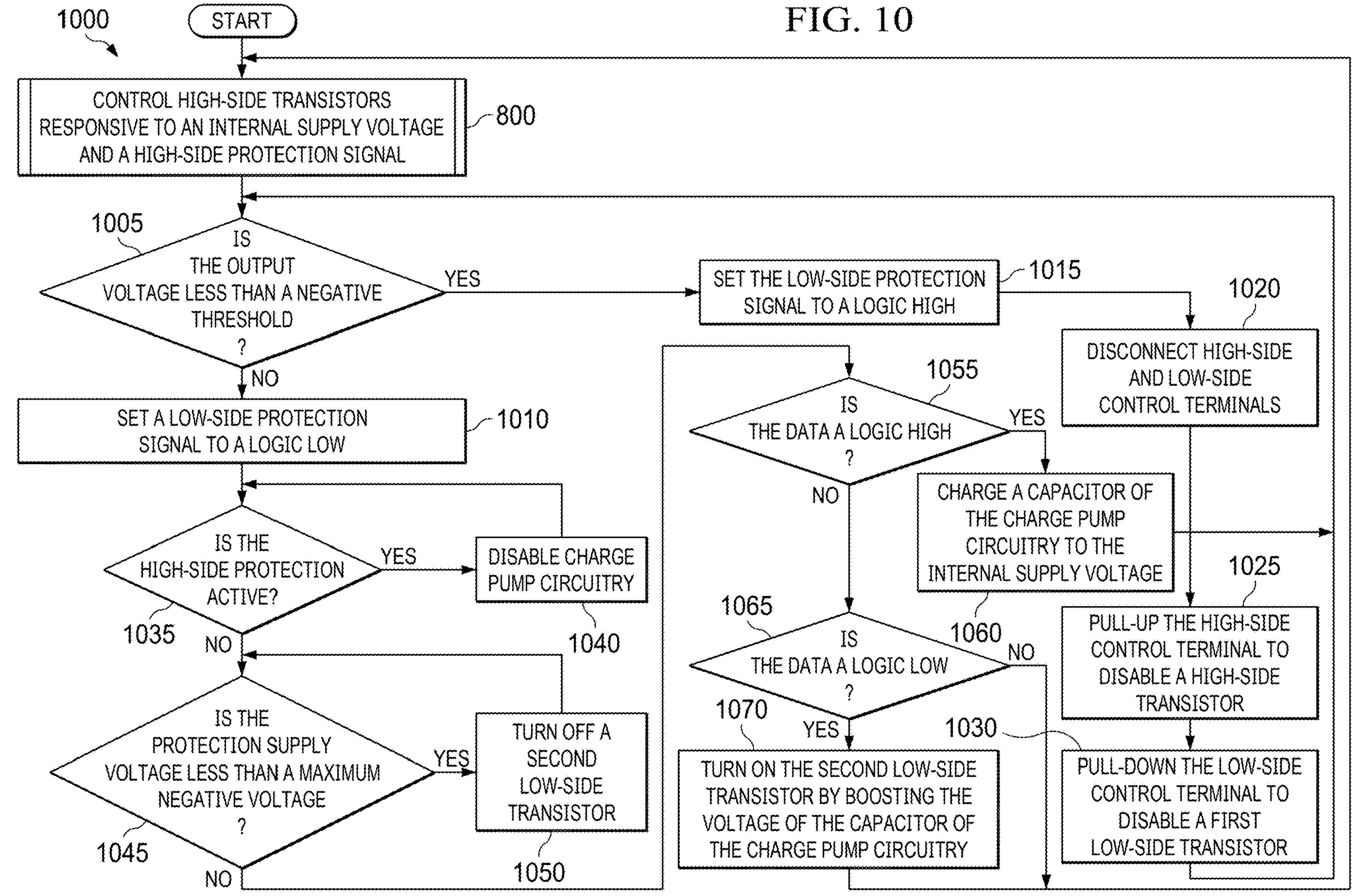
FIG. 10
1000
START
CONTROL HIGH-SIDE TRANSISTORS RESPONSIVE TO AN INTERNAL SUPPLY VOLTAGE AND A HIGH-SIDE PROTECTION SIGNAL
800
IS THE OUTPUT VOLTAGE LESS THAN A NEGATIVE THRESHOLD ?
1005
YES
NO
SET THE LOW-SIDE PROTECTION SIGNAL TO A LOGIC HIGH
1015
DISCONNECT HIGH-SIDE AND LOW-SIDE CONTROL TERMINALS
1020
SET A LOW-SIDE PROTECTION SIGNAL TO A LOGIC LOW
1010
IS THE DATA A LOGIC HIGH ?
1055
YES
NO
CHARGE A CAPACITOR OF THE CHARGE PUMP CIRCUITRY TO THE INTERNAL SUPPLY VOLTAGE
1060
IS THE HIGH-SIDE PROTECTION ACTIVE?
1035
YES
NO
DISABLE CHARGE PUMP CIRCUITRY
1040
PULL-UP THE HIGH-SIDE CONTROL TERMINAL TO DISABLE A HIGH-SIDE TRANSISTOR
1025
IS THE DATA A LOGIC LOW ?
1065
YES
NO
IS THE PROTECTION SUPPLY VOLTAGE LESS THAN A MAXIMUM NEGATIVE VOLTAGE ?
1045
YES
NO
TURN OFF A SECOND LOW-SIDE TRANSISTOR
1050
TURN ON THE SECOND LOW-SIDE TRANSISTOR BY BOOSTING THE VOLTAGE OF THE CAPACITOR OF THE CHARGE PUMP CIRCUITRY
1070
PULL-DOWN THE LOW-SIDE CONTROL TERMINAL TO DISABLE A FIRST LOW-SIDE TRANSISTOR
1030

METHODS AND APPARATUS TO CONTROL A SLEW RATE OF DRIVER CIRCUITRY

CROSS-REFERENCE TO RELATED APPLICATION

This patent application claims the benefit of and priority to U.S. Provisional Patent Application No. 63/645,263 filed May 10, 2024, which is hereby incorporated herein by reference in its entirety.

TECHNICAL FIELD

This description relates generally to driver circuitry and, more particularly, to methods and apparatus to control a slew rate of driver circuitry.

BACKGROUND

As electronics advance, systems continue to operate higher powers and higher speeds. In driver circuitry, increasingly complex circuitry implements advanced techniques for driving communicating with increasingly complex loads. Such circuitry allows the driver circuitry to precisely set a digital output despite complex operating conditions.

SUMMARY

For methods and apparatus to control a slew rate of driver circuitry, an example apparatus includes current source circuitry having a first terminal and a second terminal; current sink circuitry having a first terminal and a second terminal; a first transistor having a first terminal, a second terminal, and a control terminal, the first terminal of the first transistor coupled to the first terminal of the current source circuitry; a second transistor having a first terminal, a second terminal, and a control terminal, the first terminal of the second transistor coupled to the first terminal of the current sink circuitry; and a capacitor having a first terminal and a second terminal, the first terminal of the capacitor coupled to the second terminal of the first transistor and the second terminal of the second transistor, the second terminal of the capacitor coupled to the second terminal of the current source circuitry, the second terminal of the current sink circuitry, the control terminal of the first transistor, and the control terminal of the second transistor. Other examples are described.

For methods and apparatus to control a slew rate of driver circuitry, an example apparatus includes a first transistor having a first terminal and a control terminal; a second transistor having a first terminal, a second terminal, and a control terminal, the first terminal of the second transistor coupled to the first terminal of the first transistor and the control terminal of the first transistor; a first capacitor having a first terminal and a second terminal; a second capacitor having a first terminal and a second terminal; a third transistor having a first terminal, a second terminal, and a control terminal, the first terminal of the third transistor coupled to the second terminal of the second transistor, the first terminal of the first capacitor, and the first terminal of the second capacitor, and the control terminal of the third transistor; a fourth transistor having a first terminal and a control terminal, the first terminal of the fourth transistor coupled to the second terminal of the third transistor; a fifth transistor having a first terminal and a second terminal; and a sixth transistor having a first terminal and a second terminal, the first terminal of the sixth transistor coupled to the control terminal of the second transistor, the second terminal of the first capacitor, and the first terminal of the fifth transistor, the second terminal of the sixth transistor coupled to the second terminal of the second capacitor, the control terminal of the fourth transistor, and the second terminal of the fifth transistor. Other examples are described.

For methods and apparatus to control a slew rate of driver circuitry, an example apparatus includes a first transistor having a first terminal and a control terminal; a second transistor having a first terminal and a control terminal; a first capacitor having a first terminal and a second terminal; a second capacitor having a first terminal and a second terminal, the first terminal of the second capacitor coupled to the first terminal of the first transistor, the first terminal of the second transistor, and the first terminal of the first capacitor; first current source circuitry having a terminal; second current source circuitry having a terminal; a third transistor having a first terminal and a second terminal; and a fourth transistor having a first terminal and a second terminal, the first terminal of the fourth transistor coupled to the control terminal of the first transistor, the second terminal of the first capacitor, the terminal of the first current source circuitry, and the first terminal of the third transistor, the second terminal of the fourth transistor coupled to the control terminal of the second transistor, the second terminal of the second capacitor, the terminal of the second current source circuitry, and the second terminal of the third transistor. Other examples are described.

BRIEF DESCRIPTION OF THE DRAWINGS

FIG. 1 is a block diagram of an example communication system including example constant slew rate driver circuitry.

FIG. 2 is a schematic diagram of an example of the constant slew rate driver circuitry of FIG. 1.

FIG. 3 is a flowchart representative of example machine-readable instructions or example operations that may be at least one of executed, instantiated, or performed using an example implementation of the constant slew rate driver circuitry of FIGS. 1 and 2.

FIG. 8 is a flowchart representative of example machine-readable instructions or example operations that may be at least one of executed, instantiated, or performed using an example implementation of the high-side voltage protection circuitry of FIGS. 6 and 7.

FIG. 10 is a flowchart representative of example machine-readable instructions or example operations that may be at least one of executed, instantiated, or performed using an example implementation of the low-side voltage protection circuitry of FIGS. 6, 9A, and 9B.

Figure 4:
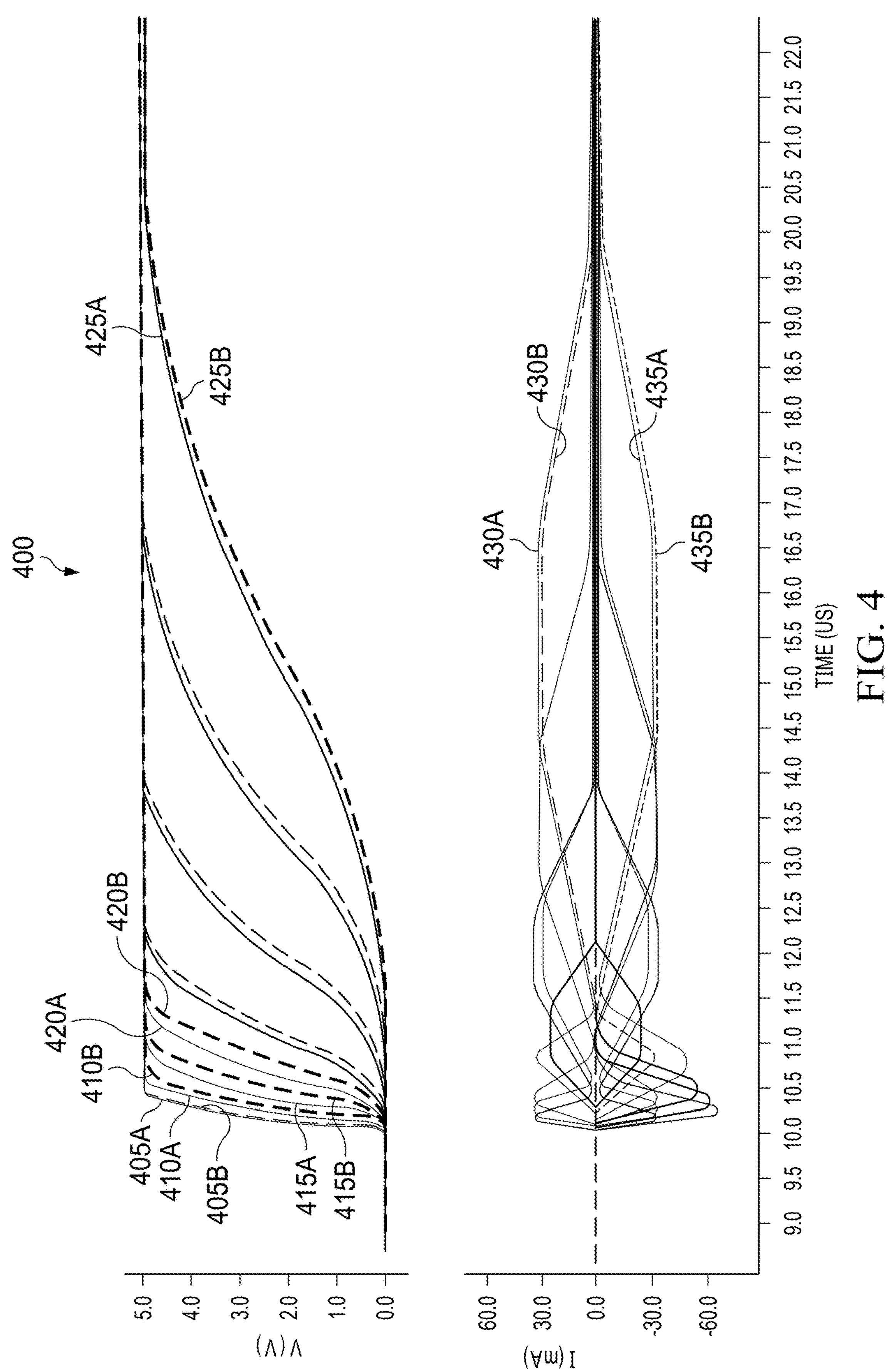
FIG. 4 is a timing diagram of example rising edge operations of the constant slew rate driver circuitry of FIGS. 1 and 2.

The drawings are not necessarily to scale. Generally, the same reference numbers in the drawing(s) and this description refer to the same or similar (functionally and/or structurally) features and/or parts. Although the drawings show regions with clean lines and boundaries, some or all of these lines and boundaries may be idealized. In reality, the boundaries or lines may be unobservable, blended or irregular.

DETAILED DESCRIPTION

As electronics continue to advance, systems have become capable of safely operating at increasingly complex operating conditions, such as higher powers and higher speeds. In driver circuitry, increasingly complex circuitry implements advanced techniques for driving communicating with increasingly complex loads. Such circuitry allows the driver circuitry to precisely set a digital output despite complex operating conditions.

As electronics continue to advance communication protocols continue to support increasing data rates. In communication systems, a maximum data rate is set based on the speed at which driver circuitry can set a voltage of an output terminal. To support increasing data rates, communication systems include increasingly advanced driver circuitry to support higher transmission speeds.

In some designs, the driver circuitry includes pre-drive stage circuitry that controls a p-channel high-side transistor and an n-channel low-side transistor. The high-side transistor pulls the output terminal of the driver circuitry towards a supply voltage to set the output voltage to a logic high state (e.g., logic one). The low-side transistor pulls the output terminal of the driver circuitry towards a common potential (e.g., ground) to set the output voltage to a logic low state (e.g., logic zero). The pre-drive stage circuitry includes logic devices and inverters to sequence turning on the high and low side transistors. In operation, the pre-driver stage circuitry receives a digital input signal from a data source. The pre-drive stage circuitry includes a cross coupled pair of logic devices that prevent both the high and low side transistors from being on (e.g., conducting current, enabled, etc.) at the same time.

For rising edge transitions of the digital input signal, the pre-drive stage circuitry turns off the low-side transistor before turning on the high-side transistor. For falling edge transitions of the digital input signal, the pre-drive stage circuitry turns off the high-side transistor before turning off the low-side transistor. However, the rate at which the output voltage transitions from a first logical state to a second logical state (also referred to as a slew rate) depends on the capacitance of a load coupled to the output terminal of the driver circuitry. In some designs the capacitance of the load may be unknown or vary as the communication system operates. In such designs, the slew rate of the output voltage of the driver circuitry varies or may be unknown. Some designs limit the maximum transmission speed to account for variations in the slew rate at the output terminal.

Also, to operate safely in relatively high voltage systems, some the driver circuitry includes circuitry to protect components from being exposed to adverse (e.g., hazardous, unsafe, dangerous, etc.) voltages. If not handled, the adverse voltages may damage other components of the communication system, such as power supplies or the data source. In automotive applications, the driver circuitry may be exposed to (e.g., shorted to) twenty volts at the output terminal despite the driver circuitry only supporting five-volt communications. Such an adverse voltage can damage the voltage source that supplies the supply voltage to the high-side transistor or reverse bias the common terminal that supplies the common potential to the low-side transistor.

Some driver circuitry designs use drain extended transistors for the high and low side transistors. Drain extended transistors allow the voltage of a drain terminal to be pulled to a voltage substantially larger than the voltage of the source terminal. However, implementing drain extended transistors in a die results in body diodes. When forward biased, currents through the body diodes may result in exposing the driver circuitry and communication system to undesired voltages.

Examples described herein include methods and apparatus to control a slew rate of driver circuitry using constant slew rate driver circuitry. In some described examples, the constant slew rate driver circuitry includes a high-side transistor, a low-side transistor, a capacitor, current source circuitry, and current sink circuitry. The high and low side transistors drive an output voltage at an output terminal of the constant slew rate driver circuitry. The current source circuitry pulls up (e.g., towards a supply voltage) control terminals of the high and low side transistors to generate a falling edge at the output terminal responsive to a logic low state of a digital input. During such example operations, the current source circuitry supplies current to the control terminals of the high and low side transistors and the capacitor. The current sink circuitry pulls down (e.g., towards a common potential) the control terminals of the high and low side transistors to generate a rising edge at the output terminal responsive to a logic high state of the digital input. During such example operations, the current sink circuitry sinks current from the control terminals of the high and low side transistors and the capacitor. The capacitor couples the control terminals of the high and low side transistors to the output terminal of the constant slew rate driver circuitry. Advantageously, driving the high and low side transistors using the current source circuitry, the current sink circuitry, and the capacitor generates a shoot through current, which sets the output voltage independently of the capacitance of a load.

In some described examples, the constant slew rate driver circuitry further includes a second high-side transistor, a second low-side transistor, high-side voltage protection circuitry, and low-side voltage protection circuitry. In such described examples, the voltage protection circuitry generates voltage protection signals responsive to detecting adverse voltages. The voltage protection signals control the second high and low side transistors and protect the driver circuitry from exposing other components of the communication system to the adverse voltages. In some example operations, the voltage protection signals disconnect the control terminals of the first high and low side transistors. In such example operations, the voltage protection signals further enable additional transistors to disable the first high and low side transistors by reducing the gate-to-source voltages. Also, the voltage protection signals disable the second high and low side transistors to prevent body diodes of the first high and low side transistors from being forward biased. Advantageously, the second high and low side transistors and the voltage protection circuitry protect the driver circuitry from adverse voltages.

FIG. 1 is a block diagram of an example communication system 100. In the example of FIG. 1, the communication system 100 includes a device 110 and a load 120. The example device 110 of FIG. 1 includes an example digital core 130, example constant slew rate driver circuitry 140, and example input buffer circuitry 150 (IN_BUFF). In the example of FIG. 1, the communication system 100 implements a digital communication protocol, such as single edge nibble transmission (SENT) communication protocols, pulse width modulation (PWM) communication protocols, SWIFT, etc. In such examples, both the device 110 and the load 120 are structured to receive and transmit data using the digital communication protocol.

The device 110 has a terminal coupled to the load 120. In some examples, the terminal of the device 110 is a bi-directional communication terminal, which allows the device 110 to communicate with the load 120. The load 120 has a terminal coupled to the device 110. In the example of FIG. 1, the terminal of the load 120 is a bi-directional communication terminal, which allows the load 120 to communicate with the device 110. In some examples, the device 110 is coupled to the load 120 by one or more additional connections. In such examples, the one or more additional connections allow the device 110 and the load 120 to communicate using single direction communication channels or with multiple bi-directional communication channels.

The digital core 130 as a first terminal and a second terminal. The first terminal of the digital core 130 is coupled to the constant slew rate driver circuitry 140. In some examples, the first terminal of the digital core 130 is referred to as a transmit output (TX). The second terminal of the digital core 130 is coupled to the buffer circuitry 150. In some examples, the second terminal of the digital core 130 is referred to as a receive input (RX). In the example of FIG. 1, the digital core 130 is structured as programmable circuitry, which uses the constant slew rate driver circuitry 140 to interface with the load 120.

The constant slew rate driver circuitry 140 has a first terminal and a second terminal. The first terminal of the constant slew rate driver circuitry 140 is coupled to the digital core 130. The second terminal of the constant slew rate driver circuitry 140 is coupled to the load 120 and the buffer circuitry 150. Examples of the constant slew rate driver circuitry 140 are illustrated and described in connection with FIGS. 2, 6, 7, 9A, and 9B, below.

The buffer circuitry 150 has a first terminal and a second terminal. The first terminal of the buffer circuitry 150 is coupled to the load 120 and the constant slew rate driver circuitry 140. The second terminal of the buffer circuitry 150 is coupled to the digital core 130. In some examples, the constant slew rate driver circuitry 140 or the buffer circuitry 150 may be included in the digital core 130.

In example operation, the digital core 130 supplies a digital signal to the constant slew rate driver circuitry 140. The digital core 130 generates the digital signal to have logical states (e.g., logic high or logic low) that corresponds to data to be transmitted to the load 120. The constant slew rate driver circuitry 140 generates an output voltage having a logical state that matches the logical state of the digital signal. As further described below in connection with FIGS. 3, 8, and 10, the constant slew rate driver circuitry 140 is structured to generate rising and falling edges having a slew rate that is independent of the capacitance of the load 120. The load 120 receives data from the device 110 responsive to sampling the output voltage of the constant slew rate driver circuitry 140. Advantageously, the constant slew rate driver circuitry 140 allows the device 110 to support lower timing margins and support higher speed communications. Further example operations of the constant slew rate driver circuitry 140 are illustrated and described in connection with FIGS. 3, 8, and 10, below.

FIG. 2 is a schematic diagram of example constant slew rate driver circuitry 200, which is an example of the constant slew rate driver circuitry 140 of FIG. 1. In the example of FIG. 2, the constant slew rate driver circuitry 200 includes a first transistor 210, first current source circuitry 220, an inverter 230, a capacitor 240, a second transistor 250, and second current source circuitry 260.

The constant slew rate driver circuitry 200 has an input terminal, an output terminal, a first supply terminal, and a second supply terminal. The input terminal of the constant slew rate driver circuitry 200 is structured to be coupled to external circuitry (e.g., the digital core 130 of FIG. 1), which supplies a digital input signal (DIN). The output terminal of the constant slew rate driver circuitry 200 is structured to be coupled to the load 120 of FIG. 1, which is illustratively represented by a resistor 270 and a capacitor 280. The first supply terminal of the constant slew rate driver circuitry 200 is structured to be coupled to a power supply, which supplies a supply voltage ($V_{CC}$). The second supply terminal of the constant slew rate driver circuitry 200 is structured to be coupled to a common terminal, which supplies the common potential (e.g., ground, AVSS, etc.). Another example of the constant slew rate driver circuitry 200 is illustrated and described in connection with FIGS. 6, 7, 9A, and 9B, below. Example operations of the constant slew rate driver circuitry 200 are illustrated and described in connection with FIG. 3, below.

The transistor 210 (also referred to as a high-side transistor) has a first terminal, a second terminal, a third terminal, and a control terminal. Also, the transistor 210 has a body diode 210A, which is an illustrative example of a diode formed by implementing the transistor 210 in a die. The first and second terminals of the transistor 210 are coupled to the first supply input of the constant slew rate driver circuitry 200, which supplies the supply voltage. The third terminal of the transistor 210 is coupled to the capacitors 240, 280, the transistor 250, and the resistor 270. The control terminal of the transistor 210 is coupled to the current source circuitry 220, 260, the capacitor 240, and the transistor 250. The diode 210A couples the first and second terminals of the transistor 210 to the third terminal of the transistor 210.

The current source circuitry 220 has a first terminal, a second terminal, and a control terminal. The first terminal of the current source circuitry 220 is coupled to the first supply terminal of the constant slew rate driver circuitry 200, which supplies the supply voltage. The second terminal of the current source circuitry 220 is coupled to the transistors 210, 250, the capacitor 240, and the current source circuitry 260. The control terminal of the current source circuitry 220 is coupled to the inverter 230. In some examples, the current source circuitry 220 has additional input(s) that are structured to receive trim bits (illustrated by a dashed arrow). In such examples, the trim bits set the magnitude of current being supplied by the current source circuitry 220.

The inverter 230 has a first terminal and a second terminal. The first terminal of the inverter 230 is coupled to the input terminal of the constant slew rate driver circuitry 200, which supplies the digital input signal. The second terminal of the inverter 230 is coupled to the current source circuitry 220.

The capacitor 240 has a first terminal and a second terminal. The first terminal of the capacitor 240 is coupled to the transistors 210, 250, the resistor 270, and the capacitor 280, which form the output terminal of the constant slew rate driver circuitry 200. The second terminal of the capacitor 240 is coupled to the transistors 210, 250 and the current source circuitry 220, 260.

The transistor 250 (also referred to as a low-side transistor) has a first terminal, a second terminal, a third terminal, and a control terminal. Also, the transistor 250 has a body diode 250A, which is an illustrative example of a diode formed by implementing the transistor 250 in a die. The first terminal of the transistor 250 is coupled to the transistor 210, the capacitors 240, 280, and the resistor 270. The second and third terminals of the transistor 250 are coupled to the second supply input of the constant slew rate driver circuitry 200, which supplies the common potential. The control terminal of the transistor 250 is coupled to the transistor 210, the current source circuitry 220, 260, and the capacitor 240. The diode 250A couples the first terminal of the transistor 250 to the second and third terminals of the transistor 250.

The current source circuitry 260 (also referred to as current sink circuitry) has a first terminal, a second terminal, and a control terminal. The first terminal of the current source circuitry 260 is coupled to the transistors 210, 250, the current source circuitry 220, and the capacitor 240. The second terminal of the current source circuitry 260 is coupled to the second supply terminal of the constant slew rate driver circuitry 200, which supplies the common potential. The control terminal of the current source circuitry 260 is coupled to the input terminal of the constant slew rate driver circuitry 200, which supplies the digital input signal. In some examples, the current source circuitry 260 has additional input(s) that are structured to receive trim bits. In such examples, the trim bits set the magnitude of current being sunk by the current source circuitry 260.

In the example of FIG. 2, the transistor 250 is an n-channel metal-oxide semiconductor field-effect transistor (MOSFET). Alternatively, the transistor 250 may be an n-channel field-effect transistors (FET), an n-channel insulated-gate bipolar transistor (IGBT), an n-channel junction field effect transistors (JFET), an NPN bipolar junction transistors (BJT) or, with slight modifications, a p-type equivalent device. In the example of FIG. 2, the transistor 210 is a p-channel MOSFET. Alternatively, the transistor 210 may be a p-channel FET, a p-channel IGBT, a p-channel JFET, a PNP BJT, or, with slight modifications, an n-type equivalent device. The transistors 210, 250 may be depletion mode devices, drain-extended devices, enhancement mode devices, natural transistors or other type of device structure transistors. Furthermore, the transistors 210, 250 may be implemented in/over a silicon substrate (Si), a silicon carbide substrate (SiC), a gallium nitride substrate (GaN) or a gallium arsenide substrate (GaAs).

FIG. 3 is a flowchart representative of example operations 300 that may be at least one of executed, instantiated, or performed using an example implementation of the constant slew rate driver circuitry 140, 200 of FIGS. 1 and 2. The example operations 300 of FIG. 3 begin at Block 305, at which the inverter 230 of FIG. 2 and the current source circuitry 260 of FIG. 2 receive a digital input. (Block 305). In example operations, the constant slew rate driver circuitry 140, 200 may receive the digital input signal and an inverted digital input signal. In such examples, the current source circuitry 260 receives the digital input signal and the current source circuitry 220 receives the inverted digital input signal.

The current source circuitry 260 determines if there is a rising edge at the digital input. (Block 310). In example operations, the current source circuitry 260 sinks current from the transistors 210, 250 and the capacitor 240 of FIG. 2 responsive to the digital input signal being in a logic high state. In other example operations, the current source circuitry 260 is inactive (e.g., not supplying or sinking current) responsive to the digital signal being in a logic low state. The current source circuitry 260 turns on responsive to rising edges of the digital input signal. In some examples, the current source circuitry 260 may be illustrated or referred to as current sink circuitry.

If the current source circuitry 260 determines that there is a rising edge at the digital input (e.g., Block 310 returns a result of YES), the current source circuitry 260 sinks current from a control terminal. (Block 315). In example operations, the current source circuitry 260 sinks current from the transistors 210, 250 and the capacitor 240 responsive to the digital input signal being in a logic high state. In such example operations, the current source circuitry 220 no longer supplies current (e.g., turns off) to the transistors 210, 250 and the capacitor 240 responsive to the inverted digital input signal being a logic low.

The current source circuitry 260 turns on a high-side transistor. (Block 320). In example operations, the current source circuitry 260 pulls the control terminals of the transistors 210, 250 towards the common potential. In such example operations, the current source circuitry 260 turns on the transistor 210 responsive to generating a gate-to-source voltage greater than a threshold voltage.

The current source circuitry 260 generates a shoot through current using a low-side transistor. (Block 325). In example operations, as the current source circuitry 260 pulls the voltage of the control terminal towards the common potential, the transistors 210, 250 at least partially conduct current. For example, the transistors 210, 250 conduct current responsive to the gate-to-source voltage of the transistor 210 being greater than the absolute value of the threshold voltage of the transistor 210 and the gate-to-source voltage of the transistor 250 being greater than the threshold voltage of the transistor 250. During the time that the transistors 210, 250 are both conducting, the rate of change of the output voltage ($dV_{OUT}$) is approximately equal to the combination of the transconductance of the transistor 210 ($g_{mp}$) and the transconductance of the transistor 250 ($g_{mn}$) times an equivalent resistance at the output terminal of the constant slew rate driver circuitry 200 (R) and the small signal change of the control terminal ($dV_1$). The rate of change of the output voltage of the constant slew rate driver circuitry 200 during shoot through conduction may be determined using Equation (1), below.

$$dV_{OUT} = -(g_{mn} + g_{mp})RdV_1; \quad \text{Equation (1)}$$

Also, since the current source circuitry 260 is sinking current from the output terminal of the constant slew rate driver circuitry 200 through the capacitor 240, the control current ($I_{CNTRL}$) is proportional to the charging of the capacitor 240. The control current is the current being sunk by the current source circuitry 260. The control current is proportional to the capacitance of the capacitor 240 (2C) times the difference between the rate of change of the voltage at the control terminal ($dV_1/dt$) and the rate of change of the voltage at the output terminal of the constant slew rate driver circuitry 200 ($dV_{OUT}/dt$) (also referred to as the slew rate). Using the determined rates of change from Equation (1), above, and the total transconductance of the transistors 210, 250 ($g_m$), the control current may be determined in Equation (2), below. Advantageously, when the transconductance times the equivalent resistance of the resistor 270 is greater than one, the slew rate of the constant slew rate driver circuitry 140, 200 is approximately equal to the current being sunk by the current source circuitry 260 and the capacitance of the capacitor 240. Advantageously, the slew rate of the output voltage of the constant slew rate driver circuitry 140, 200 is independent of the capacitance of the load 120 (e.g., the capacitance of the capacitor 280) during shoot trough.

$$I_{CNTL} = 2C\frac{d(V_1 - V_{out})}{dt} = 2C\frac{d(V_1 + g_m R V_1)}{dt} = 2C(1 + g_m R)\frac{dV_1}{dt} = -2C\frac{dV_{out}}{dt}; \quad \text{Equation (2)}$$

To ensure that the total transconductance ($g_m$) of the transistors 210, 250 is larger than one, the transistors 210, 250 are sized to have transconductances that satisfy this requirement. Equations (3) and (4), below, may be used to determine the transconductance of the transistor 210 ($g_{mp}$) and Equations (5) and (6), below may be used to determine the transconductance of the transistor 250 ($g_{mn}$). Equation (7), below, may be used to determine the total transconductance of the transistors 210, 250. However, if the transistors 210, 250 are sized to be approximately equal and the sum of the voltage applied to the transistors 210, 250 is the supply voltage at the first supply input of the constant slew rate driver circuitry 140, 200 ($V_{CC}$), Equation (8), below, may be used to determine the transconductance of the transistors 210, 250. Advantageously, the transconductance of the transistors 210, 250 is constant and not reliant on the capacitance of the load 120 (e.g., the capacitor 280). Advantageously, the slew rate of at the output terminal of the constant slew rate driver circuitry 140, 200 is independent of the capacitance of the load 120 responsive to driving the control terminals of the transistors 210, 250 as a dominant terminal.

$$i_{DSp} = \frac{1}{2}k_p'\left(\frac{W}{L}\right)_p (Vsg - |Vtp|)^2(1 + \lambda_p V_{DS}); \quad \text{Equation (3)}$$

$$g_{mp} = \frac{di_{DSp}}{dVsg} = k_p'\left(\frac{W}{L}\right)_p (Vsg - |Vtp|); \quad \text{Equation (4)}$$

$$i_{DSn} = \frac{1}{2}k_n'\left(\frac{W}{L}\right)_n (Vgs - Vtn)^2(1 + \lambda_n V_{DS}); \quad \text{Equation (5)}$$

$$g_{mn} = \frac{di_{DSn}}{dVgs} = k_n'\left(\frac{W}{L}\right)_n (Vgs - Vtn); \quad \text{Equation (6)}$$

$$g_{mn} + g_{mp} = k_n'\left(\frac{W}{L}\right)_n (Vgs - Vtn) + k_p'\left(\frac{W}{L}\right)_p (Vsg - |Vtp|); \quad \text{Equation (7)}$$

$$g_{mn} + g_{mp} = k_n'\left(\frac{W}{L}\right)_n (V_{CC} - V_{tn} - |V_{tp}|); \quad \text{Equation (8)}$$

The transistors 210, 250 charge a load with the difference between the shoot through current and the current of the high-side transistor. (Block 330). In example operations, when the transistors 210, 250 generate the shoot-through current, the difference between the currents that the transistors 210, 250 are conducting is supplied to the capacitor 280, which represents a capacitance of the load 120 of FIG. 1. In such example operations, the excess current further reduces the impact of the capacitor 280 on timing of generating the rising edge.

The current source circuitry 260 turns off the low-side transistor. (Block 335). In example operations, the current source circuitry 260 pulls down the control terminal of the transistor 250. In such example operations, the current source circuitry 260 turns off the transistor 250.

If the current source circuitry 260 determines that there is not a rising edge at the digital input (e.g., Block 310 returns a result of NO), the current source circuitry 220 of FIG. 2 and the inverter 230 determine if there is a falling edge at the digital input. (Block 340). In example operations, the current source circuitry 220 supplies current to the transistors 210, 250, and the capacitor 240 responsive to the inverted digital input signal being in a logic high state. In other example operations, the current source circuitry 220 is inactive (e.g., not supplying current) responsive to the inverted digital signal being in a logic low state. The current source circuitry 220 turns on responsive to falling edges of the digital input signal. If the current source circuitry 220 and the inverter 230 determine that there is not a falling edge at the digital input (e.g., Block 340 returns a result of NO), control proceeds to return to Block 305.

If the current source circuitry 220 and the inverter 230 determine that there is a falling edge at the digital input (e.g., Block 340 returns a result of YES), the current source circuitry 220 supplies current to the control terminal. (Block 345). In example operations, the current source circuitry 220 begins to supply current to the transistors 210, 250 and the capacitor 240 responsive to the inverted digital input signal being in a logic high state. In such example operations, the current source circuitry 260 no longer sinks current from the transistors 210, 250 and the capacitor 240 responsive to the digital input signal being a logic low.

The current source circuitry 260 turns on the low-side transistor. (Block 350). In example operations, the current source circuitry 220 pulls the control terminals of the transistors 210, 250 towards the supply voltage. In such example operations, the current source circuitry 220 turns on the transistor 250 responsive to generating a gate-to-source voltage greater than a threshold voltage.

The current source circuitry 260 generates a shoot through current using the high-side transistor. (Block 355). In example operations, as the current source circuitry 220 pulls the voltage of the control terminal towards the supply voltage, both of the transistors 210, 250 at least partially conduct current. Similar to the example operations of Block 325, the transistors 210, 250 are sized to generate a shoot through current. Advantageously, the output voltage of falling edges have a slew rate that is independent of the capacitor 280 responsive to the control terminals of the transistor 210, 250 being the dominant terminals.

The transistors 210, 250 discharge the load with the difference between the shoot through current and the current of the low-side transistor. (Block 360). In example operations, when the transistors 210, 250 generate the shoot-through current, the difference between the currents of the transistors 210, 250 is sunk from the capacitor 280, which represents a capacitance of the load 120. In such example operations, the excess current further reduces the impact of the capacitor 280 on timing of generating the rising edge.

The current source circuitry 220 turns off the high-side transistor. (Block 365). In example operations, the current source circuitry 220 pulls up the control terminal of the transistor 210. In such example operations, the current source circuitry 220 turns off the transistor 210.

Although example methods are described with reference to the flowchart illustrated in FIG. 3, many other methods of implementing the constant slew rate driver circuitry 140, 200 of FIGS. 1 and 2 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

FIG. 4 is a timing diagram 400 of example rising edge operations of the constant slew rate driver circuitry 140, 200 of FIGS. 1 and 2. In the example of FIG. 4, the timing diagram 400 includes a first slew rate 405, a second slew rate 410, a third slew rate 415, a fourth slew rate 420, a fifth slew rate 425, a first current 430, and a second current 435. The slew rates 405, 410, 415, 420, 425 illustrate different slew rates of the output terminal of the constant slew rate driver circuitry 140, 200. In some examples, the slew rate of the constant slew rate driver circuitry 140, 200 is set by the magnitude of the currents being sunk by the current source circuitry 260 of FIG. 2. In such examples, the current source circuitry 260 may be modified to implement one of the slew rates 405, 410, 415, 420, 425 using trim bit inputs of the current source circuitry 260.

Each of the slew rates 405, 410, 415, 420, 425 include first slew rates 405A, 410A, 415A, 420A, 425A for a first output capacitance and second slew rates 405B, 410B, 415B, 420B, 425B for a second output capacitance. The first slew rates 405A, 410A, 415A, 420A, 425A represent the slew rates 405, 410, 415, 420, 425 of the output voltage of the constant slew rate driver circuitry 140, 200 when the capacitor 280 has a first capacitance. The second slew rates 405B, 410B, 415B, 420B, 425B represent the slew rates 405, 410, 415, 420, 425 of the output voltage of the constant slew rate driver circuitry 140, 200 when the capacitor 280 has a second capacitance that is greater than the first capacitance. Advantageously, the slew rates 405A, 410A, 415A, 420A, 425A are approximately equal to the slew rates 405B, 410B, 415B, 420B, 425B despite changing the output capacitance of the load 120 of FIG. 1 or the capacitor 280 of FIG. 2.

Also, the current 430 illustrates the current flowing through the transistor 210 during the rising edge of the timing diagram 400 for the slew rate 425. The current 435 illustrates the current flowing through the transistor 250 during the rising edge of the timing diagram 400 for the slew rate 425. In the example of FIG. 4, the difference between the currents 430, 435 illustrate the excess current being supplied to the capacitance at the output terminal of the constant slew rate driver circuitry 140, 200. Each of the currents 430, 435 include a first current 430A, 435A for a first output capacitance and a second current 430B, 435B for a second output capacitance. Advantageously, the currents 430A, 430B and the currents 435A, 435B are approximately equal despite variations in the output capacitance of the constant slew rate driver circuitry 140, 200.

Figure 5:
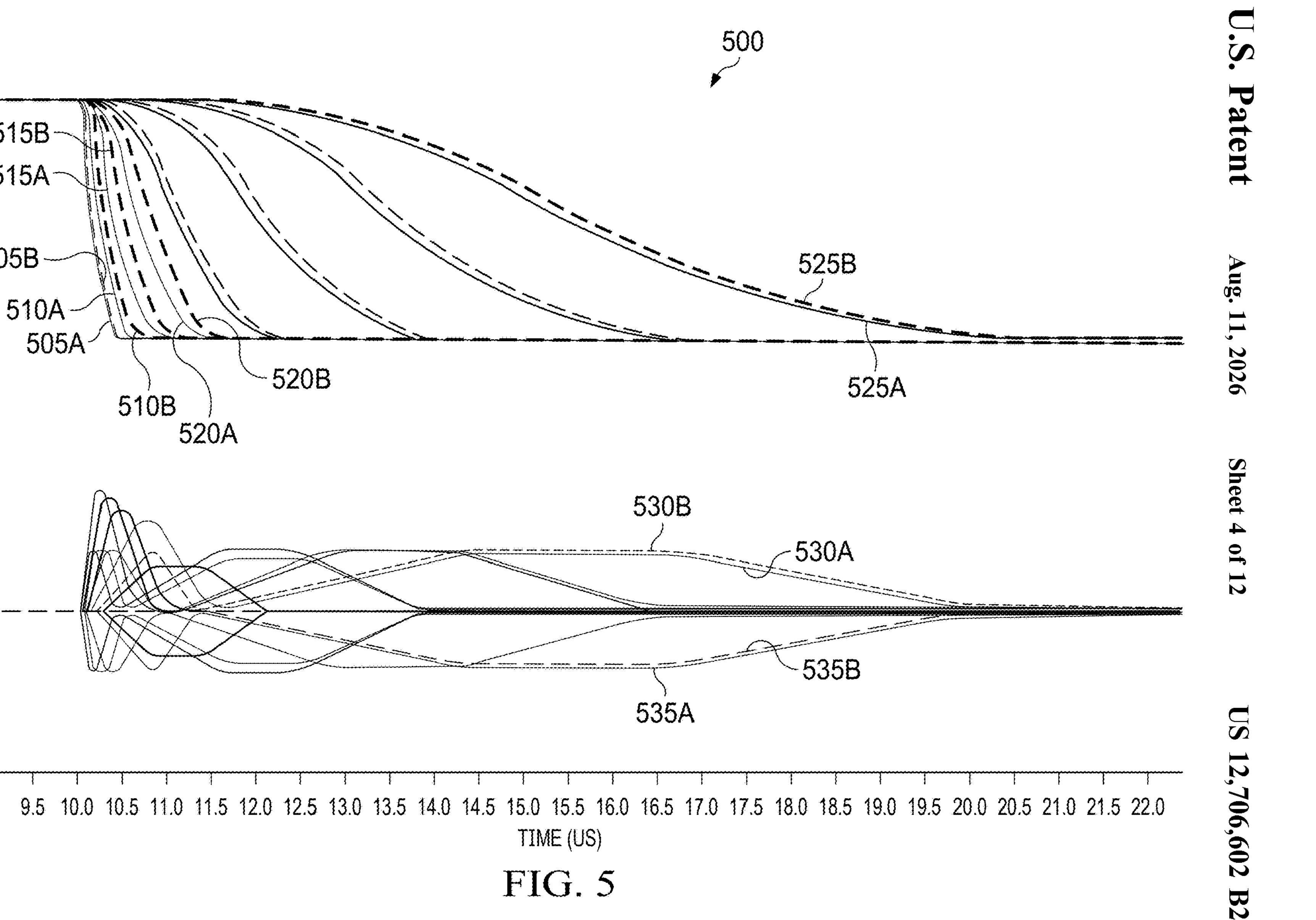
FIG. 5 is a timing diagram of example falling edge operations of the constant slew rate driver circuitry of FIGS. 1 and 2.

FIG. 5 is a timing diagram 500 of example falling edge operations of the constant slew rate driver circuitry 140, 200 of FIGS. 1 and 2. In the example of FIG. 5, the timing diagram 500 includes a first slew rate 505, a second slew rate 510, a third slew rate 515, a fourth slew rate 520, a fifth slew rate 525, a first current 530, and a second current 535. The slew rates 505, 510, 515, 520, 525 illustrate different slew rates of the output terminal of the constant slew rate driver circuitry 140, 200. In some examples, the slew rate of the constant slew rate driver circuitry 140, 200 is set by the magnitude of the currents being supplied by the current source circuitry 220 of FIG. 2. In such examples, the current source circuitry 220 may be modified to select one of the slew rates 505, 510, 515, 520, 525 using trim bit inputs of the current source circuitry 220.

Each of the slew rates 505, 510, 515, 520, 525 include a first slew rate 505A, 510A, 515A, 520A, 525A at a first output capacitance and a second slew rate 505B, 510B, 515B, 520B, 525B at a second output capacitance. The first slew rates 505A, 510A, 515A, 520A, 525A represent the slew rates 505, 510, 515, 520, 525 of the output voltage of the constant slew rate driver circuitry 140, 200 when the capacitor 280 has a first capacitance. The second slew rates 505B, 510B, 515B, 520B, 525B represent the slew rates 505, 510, 515, 520, 525 of the output voltage of the constant slew rate driver circuitry 140, 200 when the capacitor 280 has a second capacitance that is greater than the first capacitance. Advantageously, the slew rates 505A, 510A, 515A, 520A, 525A are approximately equal to the slew rates 405B, 410B, 415B, 420B, 425B despite changing the output capacitance of the load 120 of FIG. 1 or the capacitor 280 of FIG. 2.

Also, the current 530 illustrates the current flowing through the transistor 210 during the rising edge of the timing diagram 500 for the slew rate 525. The current 535 illustrates the current flowing through the transistor 250 during the rising edge of the timing diagram 500 for the slew rate 525. In the example of FIG. 5, the difference between the currents 530, 535 illustrate the excess current being supplied to the capacitance at the output terminal of the constant slew rate driver circuitry 140, 200. Each of the currents 530, 535 include a first current 530A, 535A a first output capacitance and a second current 530B, 435B for a second output capacitance. Advantageously, the currents 530A, 530B and the currents 535A, 535B are approximately equal despite variations in the output capacitance of the constant slew rate driver circuitry 140, 200.

Figure 6:
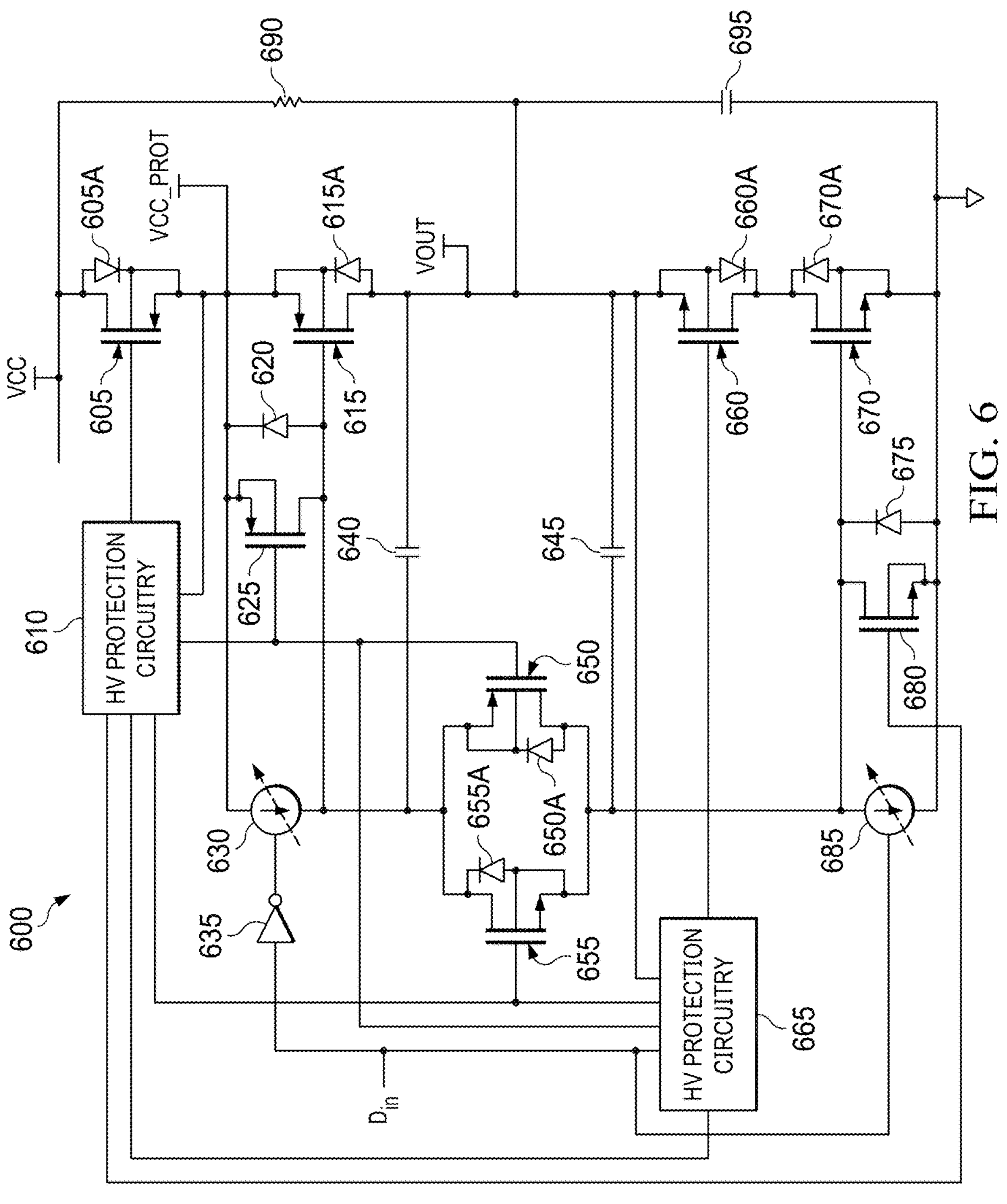
FIG. 6 is a schematic diagram of another example of the constant slew rate driver circuitry of FIG. 1 including example high and low side high voltage protection circuitry.

FIG. 6 is a schematic diagram of example constant slew rate driver circuitry 600, which is another example of the constant slew rate driver circuitry 140, 200 of FIGS. 1 and 2. In the example of FIG. 6, the constant slew rate driver circuitry 600 includes a first transistor 605, high-side voltage protection circuitry 610, a second transistor 615, a first diode 620, a third transistor 625, first current source circuitry 630, an inverter 635, a first capacitor 640, a second capacitor 645, a fourth transistor 650, a fifth transistor 655, a sixth transistor 660, low-side voltage protection circuitry 665, a seventh transistor 670, a second diode 675, an eighth transistor 680, and second current source circuitry 685.

The constant slew rate driver circuitry 600 has an input terminal, an output terminal, a first supply terminal, and a second supply terminal. The input terminal of the constant slew rate driver circuitry 600 is structured to be coupled to external circuitry (e.g., the digital core 130 of FIG. 1), which supplies a digital input signal (DIN). The output terminal of the constant slew rate driver circuitry 600 is structured to be coupled to the load 120 of FIG. 1. In the example of FIG. 6, the load 120 is illustratively represented by a resistor 690 and a capacitor 695. In the example of FIG. 6, the constant slew rate driver circuitry 600 supplies an output voltage ($V_{OUT}$) at the output terminal. The first supply terminal of the constant slew rate driver circuitry 600 is structured to be coupled to a power supply, which supplies a supply voltage ($V_{CC}$). The second supply terminal of the constant slew rate driver circuitry 600 is structured to be coupled to a common terminal, which supplies the common potential (e.g., ground, AVSS, etc.). Other examples of the constant slew rate driver circuitry 600 are illustrated and described in connection with FIGS. 2, 7, 9A, and 9B. Example operations of the constant slew rate driver circuitry 600 are illustrated and described in connection with FIGS. 3, 8, and 10.

The transistor 605 (also referred to as a high-side transistor) has a first terminal, a second terminal, a third terminal, and a control terminal. Also, the transistor 605 has a body diode 605A, which is an illustrative example of a diode formed by implementing the transistor 605 in a die. The first terminal of the transistor 605 is coupled to the first supply input of the constant slew rate driver circuitry 600, which supplies the supply voltage. The second and third terminals of the transistor 605 are coupled to the high-side protection circuitry 610, the transistors 615, 625, the diode 620, and the current source circuitry 630. The control terminal of the transistor 605 is coupled to high-side protection circuitry 610. The diode 605A couples the first terminal of the transistor 605 to the second and third terminals of the transistor 605.

The high-side protection circuitry 610 has a first terminal, a second terminal, a third terminal, a fourth terminal, a fifth terminal, and a sixth terminal. The first terminal of the high-side protection circuitry 610 is coupled to the transistor 605. The second terminal of the high-side protection circuitry 610 is coupled to the transistors 605, 615, 625, the diode 620, and the current source circuitry 630. The third terminal of the high-side protection circuitry 610 is coupled to the transistors 625, 650. The fourth terminal of the high-side protection circuitry 610 is coupled to the transistor 655 and the low-side protection circuitry 665. The fifth terminal of the high-side protection circuitry 610 is coupled to the transistor 680. The sixth terminal of the high-side protection circuitry 610 is coupled to the low-side protection circuitry 665. An example of the high-side protection circuitry 610 is illustrated and described in connection with FIG. 7, below. Example operations of the high-side protection circuitry 610 are illustrated and described in connection with FIG. 8, below.

The transistor 615 (also referred to as a high-side transistor) has a first terminal, a second terminal, a third terminal, and a control terminal. Also, the transistor 615 has a body diode 615A, which is an illustrative example of a diode formed by implementing the transistor 615 in a die. The first and second terminals of the transistor 615 are coupled to the transistors 605, 625, the high-side protection circuitry 610, the diode 620, and the current source circuitry 630. The third terminal of the transistor 615 is coupled to the capacitors 640, 645, 695, the transistor 660, and the resistor 690. The control terminal of the transistor 615 is coupled to the diode 620, the transistors 625, 650, 655, the current source circuitry 630, and the capacitor 640. The diode 615A couples the first and second terminals of the transistor 615 to the third terminal of the transistor 615. The transistor 615 is another example of the transistor 210 of FIG. 2.

The diode 620 has a first terminal and a second terminal. The first terminal of the diode 620 is coupled to the transistors 605, 615, 625, the high-side protection circuitry 610, and the current source circuitry 630. The second terminal of the diode 620 is coupled to the transistors 615, 625, 650, 655, the current source circuitry 630, and the capacitor 640. In the example of FIG. 6, the diode 620 is a Zener diode.

The transistor 625 has a first terminal, a second terminal, and a control terminal. The first terminal of the transistor 625 is coupled to the transistors 605, 615, the high-side protection circuitry 610, the diode 620, and the current source circuitry 630. The second terminal of the transistor 625 is coupled to the transistors 615, 650, 655, the diode 620, the current source circuitry 630, and the capacitor 640. The control terminal of the transistor 625 is coupled to the voltage protection circuitry 610, 665 and the transistor 650.

The current source circuitry 630 has a first terminal, a second terminal, and a control terminal. The first terminal of the current source circuitry 630 is coupled to the transistors 605, 615, 625, the high-side protection circuitry 610, and the diode 620. The second terminal of the current source circuitry 630 is coupled to the transistors 615, 625, 650, 655, the diode 620, and the capacitor 640. The control terminal of the current source circuitry 630 is coupled to the inverter 635. In some examples, the current source circuitry 630 has additional input(s) that are structured to receive trim bits. In such examples, the trim bits set the magnitude of current being supplied by the current source circuitry 630. The current source circuitry 630 is another example of the current source circuitry 220 of FIG. 2.

The inverter 635 has a first terminal and a second terminal. The first terminal of the inverter 635 is coupled to the input terminal of the constant slew rate driver circuitry 600, which supplies the digital input signal. The second terminal of the inverter 635 is coupled to the current source circuitry 630. The inverter 635 is another example of the inverter 230 of FIG. 2.

The capacitor 640 has a first terminal and a second terminal. The first terminal of the capacitor 640 is coupled to the transistors 615, 660, the capacitors 645, 695, and the resistor 690. The second terminal of the capacitor 640 is coupled to the transistors 615, 625, 650, 655, the diode 620, and the current source circuitry 630.

The capacitor 645 has a first terminal and a second terminal. The first terminal of the capacitor 645 is coupled to the transistors 615, 660, the capacitors 640, 695, and the resistor 690. The second terminal of the capacitor 645 is coupled to the transistors 650, 655, 660, 670, 680, the diode 675, and the current source circuitry 685.

The transistor 650 has a first terminal, a second terminal, a third terminal, and a control terminal. Also, the transistor 650 has a body diode 650A, which is an illustrative example of a diode formed by implementing the transistor 650 in a die. The first and second terminals of the transistor 650 are coupled to the transistors 615, 625, 655, the diode 620, the current source circuitry 630, and the capacitor 640. The third terminal of the transistor 650 is coupled to the capacitor 645, the transistors 655, 660, 670, 680, the diode 675, and the current source circuitry 685. The control terminal of the transistor 650 is coupled to the voltage protection circuitry 610, 665, and the transistor 625. The diode 650A couples the first and second terminals of the transistor 650 to the third terminal of the transistor 650.

The transistor 655 has a first terminal, a second terminal, a third terminal, and a control terminal. Also, the transistor 655 has a body diode 655A, which is an illustrative example of a diode formed by implementing the transistor 655 in a dic. The first terminal of the transistor 650 is coupled to the transistors 615, 625, 650, the diode 620, the current source circuitry 630, and the capacitor 640. The second and third terminals of the transistor 655 are coupled to the capacitor 645, the transistors 650, 660, 670, 680, the diode 675, and the current source circuitry 685. The control terminal of the transistor 655 is coupled to the voltage protection circuitry 610, 665. The diode 655A couples the first terminal of the transistor 655 to the second and third terminals of the transistor 655.

The transistor 660 (also referred to as a low-side transistor) has a first terminal, a second terminal, a third terminal, and a control terminal. Also, the transistor 660 has a body diode 660A, which is an illustrative example of a diode formed by implementing the transistor 660 in a die. The first and second terminals of the transistor 650 are coupled to the transistor 615, the capacitors 640, 645, 695, the low-side protection circuitry 665, and the resistor 690. The third terminal of the transistor 660 is coupled to the transistor 670. The control terminal of the transistor 660 is coupled to the low-side protection circuitry 665. The diode 660A couples the first and second terminals of the transistor 660 to the third terminal of the transistor 660.

The low-side protection circuitry 665 has a first terminal, a second terminal, a third terminal, a fourth terminal, a fifth terminal, and a sixth terminal. The first terminal of the low-side protection circuitry 665 is coupled to the input terminal of the constant slew rate driver circuitry 600, which supplies the digital input signal. The second and third terminals of the low-side protection circuitry 665 are coupled to the high-side protection circuitry 610. The fourth terminal of the low-side protection circuitry 665 is coupled to the transistors 615, 660, the capacitors 640, 645, and the resistor 690. The fifth terminal of the low-side protection circuitry 665 is coupled to the high-side protection circuitry 610 and the transistors 625, 650. The sixth terminal of the low-side protection circuitry 665 is coupled to the high-side protection circuitry 610 and the transistor 655. An example of the low-side protection circuitry 665 is illustrated and described in connection with FIGS. 9A and 9B, below. Example operations of the low-side protection circuitry 665 are illustrated and described in connection with FIG. 10, below.

The transistor 670 (also referred to as a low-side transistor) has a first terminal, a second terminal, a third terminal, and a control terminal. Also, the transistor 670 has a body diode 670A, which is an illustrative example of a diode formed by implementing the transistor 670 in a die. The first terminal of the transistor 670 is coupled to the transistor 660. The second and third terminals of the transistor 670 are coupled to the second supply terminal of the constant slew rate driver circuitry 600, which supplies the common potential. The control terminal of the transistor 670 is coupled to capacitor 645, the transistors 650, 655, 680, the diode 675, and the current source circuitry 685. The diode 670A couples the first terminal of the transistor 670 to the second and third terminals of the transistor 670. The transistor 670 is another example of the transistor 250 of FIG. 2.

The diode 675 has a first terminal and a second terminal. The first terminal of the diode 675 is coupled to the capacitor 645, the transistors 650, 655, 670, 680, and the current source circuitry 685. The second terminal of the diode 675 is coupled to the second supply terminal of the constant slew rate driver circuitry 600, which supplies the common potential. In the example of FIG. 6, the diode 675 is a Zener diode.

The transistor 680 has a first terminal, a second terminal, and a control terminal. The first terminal of the transistor 680 is coupled to the capacitor 645, the transistors 650, 655, 670, the diode 675, and the current source circuitry 685. The second terminal of the transistor 680 is coupled to the second supply terminal of the constant slew rate driver circuitry 600, which supplies the common potential. The control terminal of the transistor 680 is coupled to the high-side protection circuitry 610.

The current source circuitry 685 has a first terminal, a second terminal, and a control terminal. The first terminal of the current source circuitry 685 is coupled to the capacitor 645, the transistors 650, 655, 670, 680, and the diode 675. The second terminal of the current source circuitry 685 is coupled to the second supply terminal of the constant slew rate driver circuitry 600, which supplies the common potential. The control terminal of the current source circuitry 685 is coupled to the input terminal of the constant slew rate driver circuitry 600, which supplies the digital input signal. In some examples, the current source circuitry 685 has additional input(s) that are structured to receive trim bits. In such examples, the trim bits set the magnitude of current being sunk by the current source circuitry 685. Also, the current source circuitry 685 is structured to sink current from the capacitor 645. In such examples, the current source circuitry 685 may be referred to as current sink circuitry. The current source circuitry 685 is another example of the current source circuitry 260 of FIG. 2.

The resistor 690 has a first terminal and a second terminal. The first terminal of the resistor 690 is coupled to the first supply terminal of the constant slew rate driver circuitry 600, which supplies the supply voltage. The second terminal of the resistor 690 is coupled to the transistors 615, 660, the capacitors 640, 645, 695, and the low-side protection circuitry 665.

The capacitor 695 has a first terminal and a second terminal. The first terminal of the capacitor 695 is coupled to the transistors 615, 660, the capacitors 640, 645, the low-side protection circuitry 665, and the resistor 690. The second terminal of the capacitor 695 is coupled to the second supply terminal of the constant slew rate driver circuitry 600, which supplies the common potential.

In the example of FIG. 6, the resistor 690 and the capacitor 695 are an illustrative representation of a load (e.g., the load 120) that is coupled to the constant slew rate driver circuitry 600. For example, the resistor 690 represents an equivalent resistance of the load 120 and the capacitor 695 represents an equivalent capacitance of the load 120. In example operation, the constant slew rate driver circuitry 600 supplies the output voltage to the resistor 690 and the capacitor 695. Advantageously, the constant slew rate driver circuitry 600 implements the operations 300 of FIG. 3 to generate rising and falling edges having a slew rate that is independent of the equivalent capacitance of the capacitor 695. Also, example operations of the constant slew rate driver circuitry 600 are further described and illustrated in connection with FIGS. 8 and 10, below.

In the example of FIG. 6, the transistors 655, 660, 670 are n-channel MOSFETs. Alternatively, the transistors 655, 660, 670 may be n-channel FETs, n-channel IGBTs, n-channel JFETs, NPN BJTs or, with slight modifications, p-type equivalent devices. In the example of FIG. 6, the transistors 605, 615, 650 are p-channel MOSFETs. Alternatively, the transistors 605, 615, 650 may be p-channel FETs, p-channel IGBTs, p-channel JFETs, PNP BJTs, or, with slight modifications, N-type equivalent devices. The transistors 605, 615, 650, 655, 660, 670 may be depletion mode devices, drain-extended devices, enhancement mode devices, natural transistors or other type of device structure transistors. Furthermore, the transistors 605, 615, 650, 655, 660, 670 may be implemented in/over a silicon substrate (Si), a silicon carbide substrate (SiC), a gallium nitride substrate (GaN) or a gallium arsenide substrate (GaAs).

Figure 7:
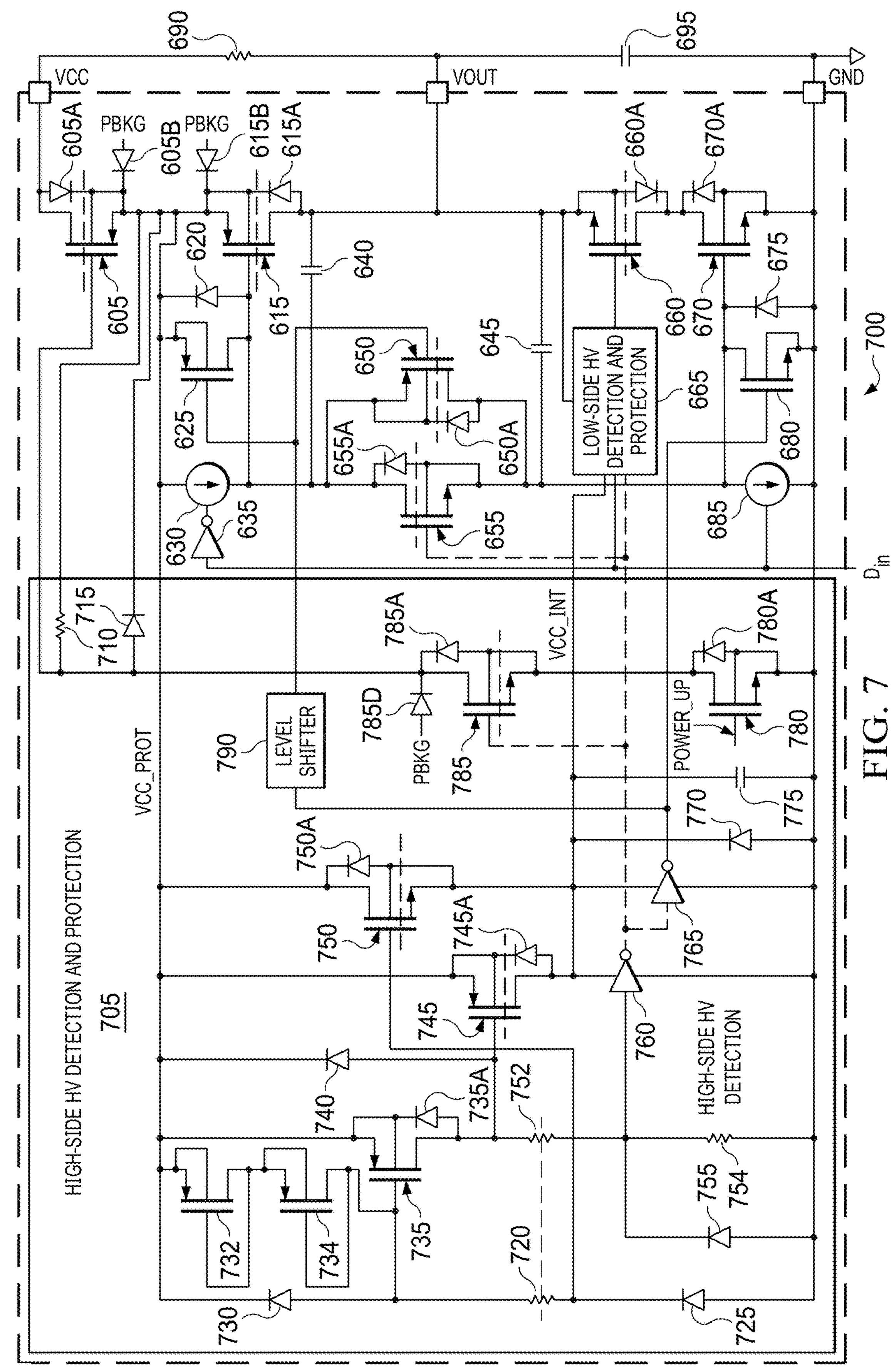
FIG. 7 is a schematic diagram of an example of the high-side voltage protection circuitry of FIG. 6.

FIG. 7 is a schematic diagram of example constant slew rate driver circuitry 700, which is another example of the constant slew rate driver circuitry 140, 200, 600 of FIGS. 1, 2, and 6. In the example of FIG. 7, the constant slew rate driver circuitry 700 includes transistors 605, 615, 625, 650, 655, 660, 670, 680 of FIG. 6, the diodes 620, 675 of FIG. 6, the current source circuitry 630, 685 of FIG. 6, the inverter 635 of FIG. 6, the capacitors 640, 645 of FIG. 6, the low-side voltage protection circuitry 665 of FIG. 6, and an example high-side voltage protection circuitry 705. The example high-side voltage protection circuitry 705 of FIG. 7 includes a first example resistor 710, a first example diode 715, a second example resistor 720, a second example diode 725, a third example diode 730, a first example transistor 732, a second example transistor 734, a third example transistor 735, a fourth example diode 740, a fourth example transistor 745, a fifth example transistor 750, a third example resistor 752, a fourth example resistor 754, a fifth example diode 755, a first example inverter 760, a second example inverter 765, a sixth example diode 770, an example capacitor 775, a sixth example transistor 780, a seventh example transistor 785, and example level shifter circuitry 790.

The constant slew rate driver circuitry 700 has an input terminal, an output terminal, a first supply terminal, and a second supply terminal. The input terminal of the constant slew rate driver circuitry 700 is structured to be coupled to external circuitry (e.g., the digital core 130 of FIG. 1), which supplies a digital input signal (DIN). The output terminal of the constant slew rate driver circuitry 700 is structured to be coupled to the load 120 of FIG. 1, which is illustratively represented by the resistor 690 of FIG. 6 and the capacitor 695 of FIG. 6. In the example of FIG. 7, the constant slew rate driver circuitry 700 supplies an output voltage ($V_{OUT}$) at the output terminal. The first supply terminal of the constant slew rate driver circuitry 700 is structured to be coupled to a power supply, which supplies a supply voltage ($V_{CC}$). The second supply terminal of the constant slew rate driver circuitry 700 is structured to be coupled to a common terminal, which supplies the common potential (e.g., ground, AVSS, etc.). Other examples of the constant slew rate driver circuitry 700 are illustrated and described in connection with FIGS. 2, 6, 9A, and 9B. Example operations of the constant slew rate driver circuitry 700 are illustrated and described in connection with FIGS. 3, 8, and 10.

The high-side voltage protection circuitry 705 has a first terminal, a second terminal, a third terminal, a fourth terminal, a fifth terminal, a sixth terminal, and a seventh terminal. The first terminal of the high-side voltage protection circuitry 705 is coupled to the transistor 605. The second terminal of the high-side voltage protection circuitry 705 is coupled to the transistors 605, 615, 625, the diode 620, and the current source circuitry 630. The third terminal of the high-side voltage protection circuitry 705 is coupled to the transistors 625, 650. The fourth terminal of the high-side voltage protection circuitry 705 is coupled to the transistor 655 and the low-side voltage protection circuitry 665. The fifth terminal of the high-side voltage protection circuitry 705 is coupled to the transistor 680. The sixth terminal of the high-side voltage protection circuitry 705 is coupled to the low-side protection circuitry 665. The seventh terminal of the high-side voltage protection circuitry 705 is coupled to the second supply terminal of the constant slew rate driver circuitry 700, which supplies the common potential. The high-side voltage protection circuitry 705 is an example of the high-side voltage protection circuitry 610 of FIG. 6. Example operations of the high-side voltage protection circuitry 705 are illustrated and described in connection with FIG. 8, below.

In the example of FIG. 7, the second terminal of the high-side voltage protection circuitry 705 may be referred to as a protection supply terminal, which supplies a protection supply voltage ($V_{CC\_PROT}$). In some examples, the protection supply voltage is approximately equal to the supply voltage from the first supply terminal of the constant slew rate driver circuitry 700 minus the voltage drop across the diode 605A of the transistor 605. In other examples, the protection supply voltage is approximately equal to the output voltage of the constant slew rate driver circuitry 700 minus the voltage drop across the diode 615A. In yet other examples, the protection supply voltage is approximately equal to a voltage of a package substrate minus a voltage drop across example body diodes 605B, 615B. The diode 605B is an illustrative example of a diode formed by implementing the transistor 605 in a die including the substrate. The diode 615B is an illustrative example of a diode formed by implementing the transistor 615 in a die including the substrate. Also, in the example of FIG. 7, the sixth terminal of the high-side voltage protection circuitry 705 may be referred to as an internal supply terminal, which supplies an internal supply voltage ($V_{CC}$ INT). The internal supply voltage is further described below.

The resistor 710 has a first terminal and a second terminal. The first terminal of the resistor 710 is coupled to the protection supply terminal of the high-side voltage protection circuitry 705, which supplies the protection supply voltage. The second terminal of the resistor 710 is coupled to the transistors 605, 785 and the diode 715.

The diode 715 has a first terminal and a second terminal. The first terminal of the diode 715 is coupled to the protection supply terminal of the high-side voltage protection circuitry 705, which supplies the protection supply voltage. The second terminal of the diode 715 is coupled to the transistors 605, 785 and the resistor 710.

The resistor 720 has a first terminal and a second terminal. The first terminal of the resistor 720 is coupled to the diode 730 and the transistors 734, 735. The second terminal of the resistor 720 is coupled to the diode 725 and the transistor 750.

The diode 725 has a first terminal and a second terminal. The first terminal of the diode 725 is coupled to the resistor 720 and the transistor 750. The second terminal of the diode 725 is coupled to the second supply terminal of the constant slew rate driver circuitry 700, which supplies the common potential. In the example of FIG. 7, the diode 725 is structured as clamp circuitry, which clamps the voltage difference across the diode 725 to a clamp voltage. In some examples, the diode 725 is a Zener diode.

The diode 730 has a first terminal and a second terminal. The first terminal of the diode 730 is coupled to the protection supply terminal of the high-side voltage protection circuitry 705, which supplies the protection supply voltage. The second terminal of the diode 730 is coupled to the resistor 720 and the transistors 734, 735. In the example of FIG. 7, the diode 730 is a Zener diode.

The transistor 732 has a first terminal, a second terminal, and a control terminal. The first terminal of the transistor 732 is coupled to the protection supply terminal of the high-side voltage protection circuitry 705, which supplies the protection supply voltage. The second and control terminals of the transistor 732 are coupled to the transistor 734.

The transistor 734 has a first terminal, a second terminal, and a control terminal. The first terminal of the transistor 734 is coupled to the transistor 732. The second and control terminals of the transistor 734 are coupled to the resistor 720, the diode 730, and the transistor 735.

The transistor 735 has a first terminal, a second terminal, a third terminal, and a control terminal. Also, the transistor 735 has a body diode 735A, which is an illustrative example of a diode formed by implementing the transistor 735 in a die. The first and second terminals of the transistor 735 are coupled to the protection supply terminal of the high-side voltage protection circuitry 705, which supplies the protection supply voltage. The third terminal of the transistor 735 is coupled to the diode 740, the transistor 745, and the resistor 752. The control terminal of the transistor 735 is coupled to the resistor 720, the diode 730, and the transistor 734. The diode 735A couples the first and second terminals of the transistor 735 to the third terminal of the transistor 735.

The diode 740 has a first terminal and a second terminal. The first terminal of the diode 740 is coupled to the protection supply terminal of the high-side voltage protection circuitry 705, which supplies the protection supply voltage. The second terminal of the diode 740 is coupled to the transistors 735, 745 and the resistor 752. In the example of FIG. 7, the diode 740 is a Zener diode.

The transistor 745 has a first terminal, a second terminal, a third terminal, and a control terminal. Also, the transistor 745 has a body diode 745A, which is an illustrative example of a diode formed by implementing the transistor 745 in a die. The first and second terminals of the transistor 745 are coupled to the protection supply terminal of the high-side voltage protection circuitry 705, which supplies the protection supply voltage. The third terminal of the transistor 745 is coupled to the low-side voltage protection circuitry 665, the transistor 750, the inverters 760, 765, the diode 770, and the capacitor 775. The control terminal of the transistor 745 is coupled to the transistor 735, the diode 740, and the resistor 752. The diode 745A couples the first and second terminals of the transistor 745 to the third terminal of the transistor 745.

The transistor 750 has a first terminal, a second terminal, a third terminal, and a control terminal. Also, the transistor 750 has a body diode 750A, which is an illustrative example of a diode formed by implementing the transistor 750 in a die. The first terminal of the transistor 750 is coupled to the protection supply terminal of the high-side voltage protection circuitry 705, which supplies the protection supply voltage. The second and third terminals of the transistor 750 are coupled to the low-side voltage protection circuitry 665, the transistor 745, the inverters 760, 765, the diode 770, and the capacitor 775. The control terminal of the transistor 750 is coupled to the resistor 720 and the diode 725. The diode 750A couples the first terminal of the transistor 750 to the second and third terminals of the transistor 750.

The resistor 752 has a first terminal and a second terminal. The first terminal of the resistor 752 is coupled to the transistors 735, 745 and the diode 740. The second terminal of the resistor 752 is coupled to the resistor 754, the diode 755, and the inverter 760.

The resistor 754 has a first terminal and a second terminal. The first terminal of the resistor 754 is coupled to the resistor 752, the diode 755, and the inverter 760. The second terminal of the resistor 754 is coupled to the second supply terminal of the constant slew rate driver circuitry 700, which supplies the common potential.

The diode 755 has a first terminal and a second terminal. The first terminal of the diode 755 is coupled to the resistors 752, 754 and the inverter 760. The second terminal of the diode 755 is coupled to the second supply terminal of the constant slew rate driver circuitry 700, which supplies the common potential. In the example of FIG. 7, the diode 755 is a Zener diode.

The inverter 760 has a first terminal, a second terminal, a third terminal, and a fourth terminal. The first terminal of the inverter 760 (also referred to as an input terminal) is coupled to the resistors 752, 754 and the diode 755. The second terminal of the inverter 760 (also referred to as an output terminal) is coupled to the transistors 655, 785, the low-side voltage protection circuitry 665, and the inverter 765. The third terminal of the inverter 760 is coupled to the low-side voltage protection circuitry 665, the transistors 745, 750, the inverter 765, the diode 770, and the capacitor 775. The fourth terminal of the inverter 760 is coupled to the second supply terminal of the constant slew rate driver circuitry 700, which supplies the common potential.

The inverter 765 has a first terminal, a second terminal, a third terminal, and a fourth terminal. The first terminal of the inverter 765 (also referred to as an input terminal) is coupled to the transistors 655, 785, the low-side voltage protection circuitry 665, and the inverter 760. The second terminal of the inverter 765 (also referred to as an output terminal) is coupled to the transistor 780 and the level shifter circuitry 790. The third terminal of the inverter 765 is coupled to the low-side voltage protection circuitry 665, the transistors 745, 750, the inverter 760, the diode 770, and the capacitor 775. The fourth terminal of the inverter 765 is coupled to the second supply terminal of the constant slew rate driver circuitry 700, which supplies the common potential.

The diode 770 has a first terminal and a second terminal. The first terminal of the diode 770 is coupled to the low-side voltage protection circuitry 665, the transistors 745, 750, the inverters 760, 765, and the capacitor 775. The second terminal of the diode 770 is coupled to the second supply terminal of the constant slew rate driver circuitry 700, which supplies the common potential. In the example of FIG. 7, the diode 770 is a Zener diode.

The capacitor 775 has a first terminal and a second terminal. The first terminal of the capacitor 775 is coupled to the low-side voltage protection circuitry 665, the transistors 745, 750, the inverters 760, 765, and the diode 770. The second terminal of the capacitor 775 is coupled to the second supply terminal of the constant slew rate driver circuitry 700, which supplies the common potential.

The transistor 780 has a first terminal, a second terminal, a third terminal, and a control terminal. Also, the transistor 780 has a body diode 780A, which is an illustrative example of a diode formed by implementing the transistor 780 in a die. The first terminal of the transistor 780 is coupled to the transistor 785. The second and third terminals of the transistor 780 are coupled to the second supply terminal of the constant slew rate driver circuitry 700, which supplies the common potential. The control terminal of the transistor 780 is coupled to a power up input terminal, which supplies a power-up signal representing whether the device 110 of FIG. 1 is powered up. The diode 780A couples the first terminal of the transistor 780 to the second and third terminals of the transistor 780.

The transistor 785 has a first terminal, a second terminal, a third terminal, and a control terminal. Also, the transistor 785 has a body diode 785A and a diode 785B, which are illustrative examples of diodes formed by implementing the transistor 785 in a die. The first terminal of the transistor 785 is coupled to the transistor 605, the resistor 710, and the diode 715. The second and third terminals of the transistor 785 are coupled to the transistor 780. The control terminal of the transistor 785 is coupled to the transistor 655, the low-side voltage protection circuitry 665, and the inverters 760, 765. The diode 785A couples the first terminal of the transistor 785 to the second and third terminals of the transistor 785. The diode 785B couples the first terminal of the transistor 785 to the substrate of the package containing the constant slew rate driver circuitry 700.

The level shifter circuitry 790 has a first terminal and a second terminal. The first terminal of the level shifter circuitry 790 is coupled to the transistor 680 and the inverter 765. The second terminal of the level shifter circuitry 790 is coupled to the transistors 625, 650.

In the example of FIG. 7, the transistors 655, 660, 670, 750, 780, 785 are n-channel MOSFETs. Alternatively, the transistors 655, 660, 670, 750, 780, 785 may be n-channel FETs, n-channel IGBTs, n-channel JFETs, NPN BJTs or, with slight modifications, p-type equivalent devices. In the example of FIG. 7, the transistors 605, 615, 650, 732, 734, 735, 745 are p-channel MOSFETs. Alternatively, the transistors 605, 615, 650, 732, 734, 735, 745 may be p-channel FETs, p-channel IGBTs, p-channel JFETs, PNP BJTs, or, with slight modifications, N-type equivalent devices. The transistors 605, 615, 650, 655, 660, 670, 732, 734, 735, 745, 750, 780, 785 may be depletion mode devices, drain-extended devices, enhancement mode devices, natural transistors or other type of device structure transistors. Furthermore, the transistors 605, 615, 650, 655, 660, 670, 732, 734, 735, 745, 750, 780, 785 may be implemented in/over a silicon substrate (Si), a silicon carbide substrate (SiC), a gallium nitride substrate (GaN) or a gallium arsenide substrate (GaAs).

FIG. 8 is a flowchart representative of example operations 800 that may be at least one of executed, instantiated, or performed using an example implementation of the high-side voltage protection circuitry 610, 705 of FIGS. 6 and 7, or more generally, the constant slew rate driver circuitry 600, 700 of FIGS. 6 and 7. The example operations 800 of FIG. 8 begin at Block 805, at which the transistor 780 of FIG. 7 starts power up. (Block 805). In some examples, the transistor 780 receives a power-up signal, which represents the state of the device 110 of FIG. 1. In such examples, the power-up signal turns on the transistor 780 responsive to the device 110 being turned on. In example operations, the transistor 780 allows current to flow through the resistor 710 of FIG. 7 responsive to the device 110 being powered and the inverter 760 of FIG. 7 turning on the transistor 785.

The transistor 605 of FIGS. 6 and 7 receives an increasing supply voltage. (Block 810). In some examples, the supply voltage of the constant slew rate driver circuitry 600, 700 ramps up during power up. In such examples, the device 110 includes voltage source circuitry to generate the supply voltage when powered.

The transistor 605 forward biases a first high-side FET body diode using the supply voltage to initialize a protection supply voltage. (Block 815). In example operations, the protection supply voltage ($V_{CC\_PROT}$) powers the high-side voltage protection circuitry 610, 705, which also controls the transistor 605. In such examples, as the supply voltage at the first supply terminal of the constant slew rate driver circuitry 600, 700 increases above the common potential, the diode 605A of the transistor 605 is forward biased. The diode 605A of the transistor 605 sets the protection supply voltage to a voltage equal to the supply voltage minus a voltage drop across the diode 605A. Advantageously, forward biasing the diode 605A sets the protection supply voltage, which powers up the high-side voltage protection circuitry 610, 705. Advantageously, the high-side voltage protection circuitry 610, 705 may turn-on the transistor 605 responsive to the diode 605A setting the protection supply voltage.

The transistors 745, 750 of FIG. 7 generate an internal supply voltage ($V_{CC}$_INT) using the protection supply voltage. (Block 820). In some examples, the diode 725 is a Zener diode, which clamps the voltage difference across the diode 725 at a clamp voltage. For example, the diode 725 has a maximum voltage difference of six volts responsive to being sized to have a six-volt clamp voltage. In example operations, the resistor 720 sets the control terminal of the transistor 735 approximately equal to the protection supply voltage until the protection supply voltage exceeds the clamp voltage of the diode 725. In such example operations, the resistor 720 turns off the transistor 735 responsive to the protection supply voltage being less than the clamp voltage of the diode 725.

Also, the resistor 720 and the transistors 732, 734 continue to keep the transistor 735 turned off until the protection supply voltage is greater than a combination of a rest voltage (described in further detail below) drop across the resistor 720, the clamp voltage of the diode 725, and the combined threshold voltages of the transistor 732, 734. The voltage drop across the resistor 720 is approximately equal to the current through the transistor 732, 734 times the resistance of the resistor 720, when the transistors 732, 734 are fully enabled. When the transistor 735 is turned off, the resistors 752, 754 pull the control terminal of the transistor 745 towards the common potential. During such operations, the resistors 752, 754 turn on the transistor 745 to generate an internal supply voltage that is approximately equal to the protection supply voltage. The transistor 745 supplies the internal supply voltage to the low-side voltage protection circuitry 665 of FIGS. 6 and 7, the inverters 760, 765, the diode 770, and the capacitor 775. Advantageously, the internal supply voltage powers the inverters 760, 765 and sets logic levels of the outputs of the inverters 760, 765 in relation to the common potential.

The inverters 760, 765 set a high-side protection signal to a logic low. (Block 825). In some examples, the resistor 720 and the transistors 732, 734 turn off the transistor 735 responsive to the protection supply voltage being less than the combination of the reset voltage of the resistor 720, the clamp voltage of the diode 725, and the combined threshold voltages of the transistor 732, 734. In such examples, the resistors 752, 754 pull down the input terminal of the inverter 760, which sets an inverted high-side protection signal to a logic high (e.g., a logical one). The inverter 765 generates the high-side protection signal by inverting the inverted high-side protection signal from the inverter 760, which sets the high-side protection signal to a logic low. Advantageously, the high-side protection signal represents a safe state when set to a logic low.

The transistors 650, 655 of FIGS. 6 and 7 connect high-side and low-side control terminals. (Block 830). In some examples, the inverters 760, 765 of FIG. 7 turn on (e.g., enable, cause to conduct) the transistors 650, 655 responsive to the protection supply voltage being less than a voltage that turns on the transistor 735 of FIG. 7. In such examples, the inverter 760 generates the inverted high-side protection signal having a logic high state and the inverter 765 generates the high-side protection signal having a logic low state. The transistor 650 turns on responsive to the protection signal having a logical zero state. The transistor 655 turns on responsive to the inverted protection signal having a logical one state. Advantageously, the transistors 650, 655 allow the current source circuitry 630, 685 of FIGS. 6 and 7 to control the transistors 615, 670 of FIGS. 6 and 7 when turned on.

The resistor 710 and the transistor 785 turn on the first high-side FET using the high-side protection signal. (Block 835). In some examples, the power up signal turns on the transistor 780 and the inverted high-side protection signal from the inverter 760 turns on the transistor 785 of FIG. 7. In such examples, the transistors 780, 785 form a current path through the resistor 710 responsive to being turned on. The current path through the resistor 710 generates a gate-to-source voltage across the transistor 605, which turns on the transistor 605.

The transistor 605 regulates the protection supply voltage. (Block 845). The transistor 605 sets the protection supply voltage approximately equal to the supply voltage at the first supply terminal of the constant slew rate driver circuitry 600, 700 responsive to the current through the resistor 710 and the transistors 780, 785. Advantageously, current through the resistor 710 controls the transistor 605.

The constant slew rate driver circuitry 600, 700 drives an output by controlling a control terminal. (Operations 300 of FIG. 3). Also, in some examples, the operations 300 and 1000 of FIGS. 3 and 10 may occur in parallel. For example, when the constant slew rate driver circuitry 600, 700 drives the output voltage, the low-side voltage protection circuitry 665 may perform one or more of the operations 1000 to boost the voltage at the control terminal of the transistor 660 of FIGS. 6 and 7. In such examples, boosting the voltage at the control terminal of the transistor 660 creates a positive gate-to-source voltage that allows the transistor 660 to turn on during falling edges. Such example operations are further described and illustrated in connection with FIGS. 10 and 12, below. Advantageously, the high-side voltage protection circuitry 610, 705 allow the transistors 615, 670 and the current source circuitry 630, 685 to implement the constant slew rate driver operations of FIG. 3 using the constant slew rate driver circuitry 600, 700.

The transistor 735 determines if the protection supply voltage is greater than a threshold voltage. (Block 845). In some examples, the resistor 720 and the transistors 732, 734 set the control terminal of the transistor 735 approximately equal to the protection supply voltage responsive to the protection supply voltage being less than a threshold voltage. In such examples, the threshold voltage is equal to the rest voltage of the resistor 720 plus the clamp voltage of the diode 725 plus the combined threshold voltages of the transistors 732, 734. For example, the threshold voltage is approximately equal to eight and four-tenths volts when the diode 725 has a clamp voltage of six volts and the transistors 732, 734 have a combined threshold voltage of one and four-tenths volts. In such examples, the resistance of the resistor 720 is selected to set the rest voltage of the resistor 720 to be equal to one volt. Advantageously, the transistor 735 is off when the protection supply voltage is less than the threshold voltage. Advantageously, the transistor 735 is on when the protection supply voltage is greater than the threshold voltage.

If the transistor 735 determines that the protection supply voltage is greater than the threshold voltage (e.g., Block 845 returns a result of YES), the inverters 760, 765 set the high-side protection signal to a logic high. (Block 850). In example operations, the protection supply voltage turns on the transistor 735 responsive to being greater than the threshold voltage. In such example operations, the resistors 752, 754 divide the protection supply voltage to set the input terminal of the inverter 760 to a logic high. The inverter 760 inverts the logic high to set the inverted high-side protection signal to a logic low. The inverter 765 inverts the logic low of the inverted high-side protection signal to set the high-side protection signal to a logic high. Also, the transistor 745 turns off responsive to the transistor 735 turning on. When the transistor 745 is turned off by the transistor 735, the transistor 750 continues to generate the internal supply voltage using the clamp voltage of the diode 725. For example, the transistor 750 regulates the protection supply voltage to set the internal supply voltage to five volts responsive to six volts from the diode 725. Advantageously, the logic levels of the inverted high-side protection signal and the high-side protection signal remain regulated despite the protection supply voltage being greater than the threshold voltage.

The transistors 650, 655 disconnect the high-side and low-side control terminals. (Block 855). In some examples, the inverters 760, 765 turn off the transistors 650, 655 responsive to the protection supply voltage being greater than the threshold voltage. In such examples, the inverter 760 generates the inverted high-side protection signal having a logic low state and the inverter 765 generates the high-side protection signal having a logic high state. The transistor 650 turns off responsive to the high-side protection signal having a logic high state and the transistor 655 turns off responsive to the inverted high-side protection signal having a logic low state. Also, in some examples, the level shifter circuitry 790 of FIG. 7 shifts (e.g., offsets) voltages of the logic levels of the high-side protection signal from first logic levels (e.g., zero to five volts) to shifted logic levels (e.g., the protection supply voltage minus five volts to the protection supply voltage). In such examples, the level shifter circuitry 790 uses the shifted logic levels to control the transistor 650 and 625.

The transistor 625 of FIGS. 6 and 7 pulls up the high-side control terminal to disable a second high-side transistor. (Block 860). In some examples, the high-side protection signal from the inverter 765 turns on the transistor 625 responsive to being in a logic high state. In some such examples, the level shifter circuitry 790 shifts the logic level of the high-side protection signal to be in relation to the protection supply voltage, which ensures that the transistor 625 is turned on despite relatively high protection supply voltages. In example operations, the transistor 625 prevents the transistor 615 from being turned on responsive to setting the control terminal of the transistor 615 equal to the protection supply voltage. Advantageously, the high-side voltage protection circuitry 610, 705 disables the transistor 615 responsive to detecting an unsafe protection supply voltage.

The transistor 680 of FIGS. 6 and 7 pulls down the low-side control terminal to disable a low-side transistor. (Block 865). In some examples, the high-side protection signal from the inverter 765 turns on the transistor 680 responsive to being in a logic high state. In example operation, the transistor 680 prevents the transistor 670 from being turned on responsive to setting the control terminal of the transistor 670 equal to the common potential. Advantageously, the high-side voltage protection circuitry 610, 705 disables the transistor 670 responsive to detecting an unsafe protection supply voltage. Control proceeds to return to Block 845.

If the transistor 735 determines that the protection supply voltage is not greater than the threshold voltage (e.g., Block 845 returns a result of NO), the diodes 605B, 615B, 785B of FIG. 7 determine if the protection supply voltage is less than a negative threshold voltage. (Block 870). When the supply voltage of the constant slew rate driver circuitry 600, 700 is set to a negative voltage, the voltage of the package substrate, which remains at the common potential, becomes the highest voltage in the constant slew rate driver circuitry 600, 700. For example, the supply voltage of the constant slew rate driver circuitry 600, 700 is negative if either the second supply terminal or the output terminal of the constant slew rate driver circuitry 600, 700 are set to a voltage greater than the supply voltage at the first supply terminal. During such example operations, the negative voltage forward biases the diodes 605B, 715B, 785B, which prevents the transistors 605, 615, 660, 670 from being accurately controlled by the voltage protection circuitry 610, 665, 705. If the diodes 605B, 615B, 785B determine that the protection supply voltage is not less than a negative threshold voltage, (e.g., Block 870 returns a result of NO), control proceeds to return to the operations 300 between Blocks 840, 845.

If the diodes 605B, 615B, 785B determine that the protection supply voltage is less than a negative threshold voltage, (e.g., Block 870 returns a result of YES), the resistor 710 turns off the first high-side transistor. (Block 875). In some examples, the diodes 605B, 615B, 785B supply current to the resistor 710 responsive to being forward biased. In such examples, the currents of the diodes 605B, 615B, 785B cause the resistor 710 to set the gate-to-source voltage of the transistor 605 to a voltage approaching zero, which disables the transistor 605. Advantageously, current from the diodes 605B, 615B, 785B turn off the transistor 605. Advantageously, the diodes 605B, 615B, 785B protect the first supply terminal of the constant slew rate driver circuitry 600, 700 from currents resulting from the output terminal or the second supply terminal being set to a voltage greater than the supply voltage and the voltage of the package substrate. Control proceeds to return to Block 845.

Although example methods are described with reference to the flowchart illustrated in FIG. 8, many other methods of implementing the high-side voltage protection circuitry 610, 705 or more generally the constant slew rate driver circuitry 600, 700 of FIGS. 6 and 7 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 9A:
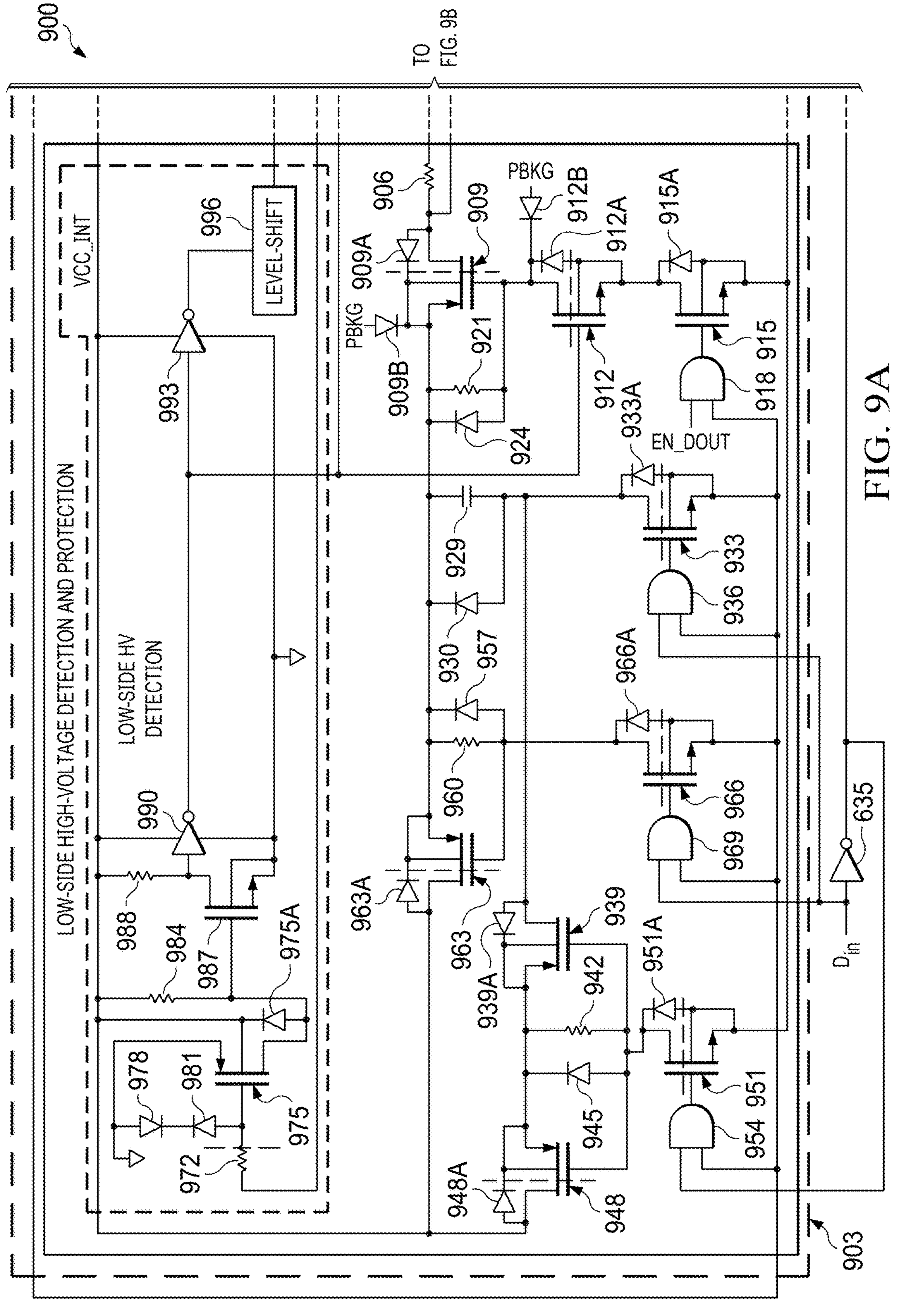
FIGS. 9A and 9B form a schematic diagram of an example of the low-side voltage protection circuitry of FIG. 6.
Figure 9B:
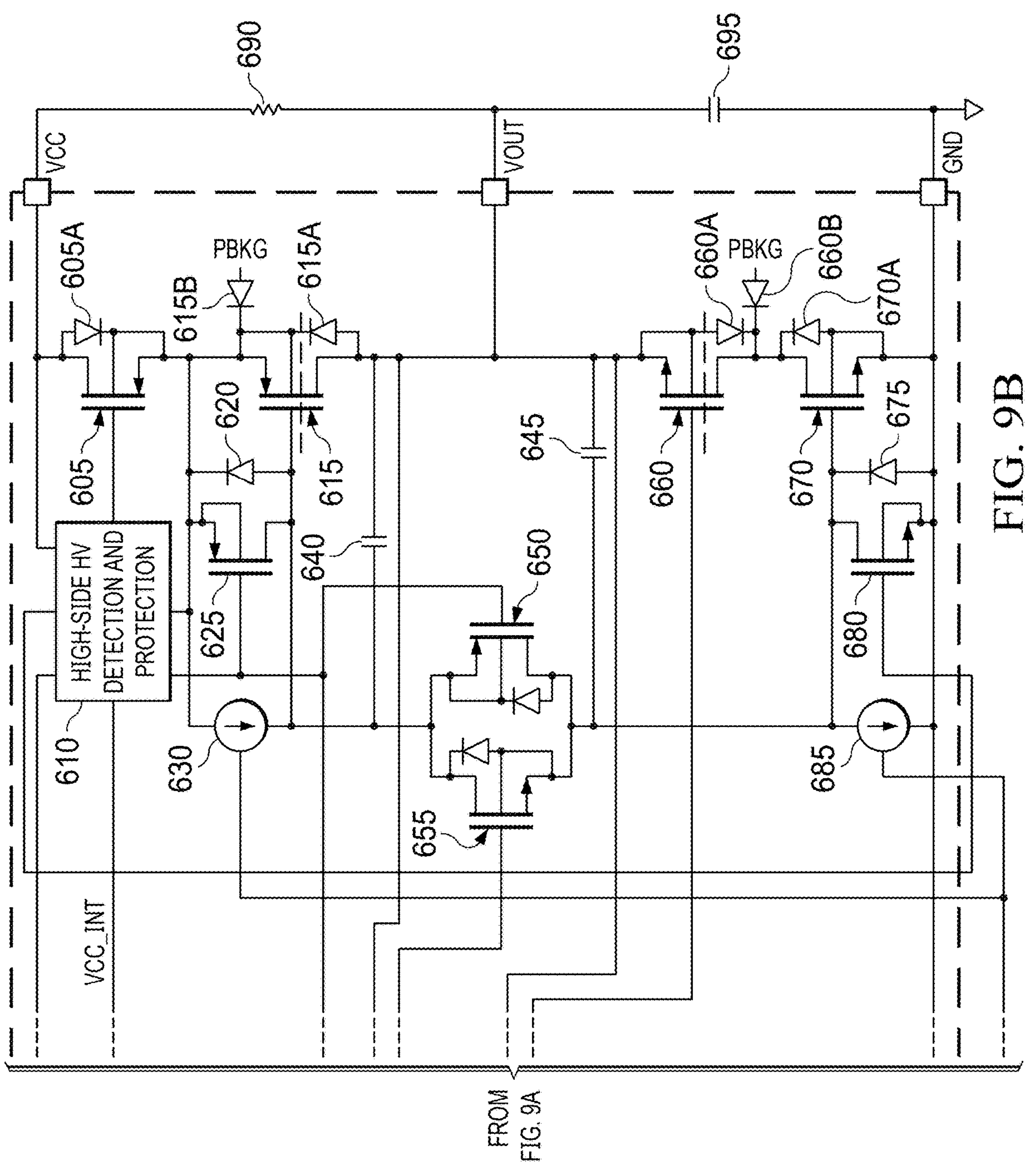

FIGS. 9A and 9B is a schematic diagram of example constant slew rate driver circuitry 900, which is another example of the constant slew rate driver circuitry 140, 200, 600, 700 of FIGS. 1, 2, 6, and 7. In the example of FIGS. 9A and 9B, the constant slew rate driver circuitry 900 includes transistors 605, 615, 625, 650, 655, 660, 670, 680 of FIG. 6, the high-side voltage protection circuitry 610 of FIG. 6, the diodes 620, 675 of FIG. 6, the current source circuitry 630, 685 of FIG. 6, the inverter 635 of FIG. 6, the capacitors 640, 645 of FIG. 6, and example low-side voltage protection circuitry 903. The example low-side voltage protection circuitry 903 of FIG. 9A includes a first example resistor 906, a first example transistor 909, a second example transistor 912, a third example transistor 915, a first example logic device 918, a second example resistor 921, a first example diode 924, an example capacitor 929, a second example diode 930, a fourth example transistor 933, a second example logic device 936, a fifth example transistor 939, a third example resistor 942, a third example diode 945, a sixth example transistor 948, a seventh example transistor 951, a third example logic device 954, a fourth example diode 957, a fourth example resistor 960, an eighth example transistor 963, a ninth example transistor 966, a fourth example logic device 969, a fifth example resistor 972, a tenth example transistor 975, a fifth example diode 978, a sixth example diode 981, a sixth example resistor 984, an eleventh transistor 987, a seventh example resistor 988, a first example inverter 990, a second example inverter 993, and example level shifter circuitry 996.

The constant slew rate driver circuitry 900 has an input terminal, an output terminal, a first supply terminal, and a second supply terminal. The input terminal of the constant slew rate driver circuitry 900 is structured to be coupled to external circuitry (e.g., the digital core 130 of FIG. 1), which supplies a digital input signal (DIN). The output terminal of the constant slew rate driver circuitry 900 is structured to be coupled to the load 120 of FIG. 1, which is illustratively represented by the resistor 690 of FIGS. 6 and 7 and the capacitor 695 of FIGS. 6 and 7. In the example of FIGS. 9A and 9B, the constant slew rate driver circuitry 900 supplies an output voltage ($V_{OUT}$) at the output terminal. The first supply terminal of the constant slew rate driver circuitry 900 is structured to be coupled to a power supply, which supplies a supply voltage ($V_{CC}$). The second supply terminal of the constant slew rate driver circuitry 900 is structured to be coupled to a common terminal, which supplies the common potential (e.g., ground, AVSS, etc.). Other examples of the constant slew rate driver circuitry 900 are illustrated and described in connection with FIGS. 2, 6, and 7. Example operations of the constant slew rate driver circuitry 900 are illustrated and described in connection with FIGS. 3, 8, and 10.

The low-side voltage protection circuitry 903 has a first terminal, a second terminal, a third terminal, a fourth terminal, a fifth terminal, and a sixth terminal. The first terminal of the low-side voltage protection circuitry 903 is coupled to the input terminal of the constant slew rate driver circuitry 900, which supplies the digital input signal. The second and third terminals of the low-side voltage protection circuitry 903 are coupled to the high-side protection circuitry 610. The fourth terminal of the low-side voltage protection circuitry 903 is coupled to the output terminal of the constant slew rate driver circuitry 900. The fifth terminal of the low-side voltage protection circuitry 903 is coupled to the high-side protection circuitry 610 and the transistors 625, 650. The sixth terminal of the low-side voltage protection circuitry 903 is coupled to the transistor 655. The low-side voltage protection circuitry 903 is an example of the low-side voltage protection circuitry 665 of FIGS. 6 and 7. Example operations of the low-side voltage protection circuitry 903 are illustrated and described in connection with FIG. 10, below.

The resistor 906 has a first terminal and a second terminal. The first terminal of the resistor 906 is coupled to the output terminal of the constant slew rate driver circuitry 900, which supplies the driver output voltage. The second terminal of the resistor 906 is coupled to the transistors 660, 909.

The transistor 909 has a first terminal, a second terminal, a third terminal, and a control terminal. Also, the transistor 909 has a first body diode 909A and a second body diode 909B, which are illustrative examples of diodes formed by implementing the transistor 909 in a die. The first terminal of the transistor 909 is coupled to the transistor 660 and the resistor 906. The second and third terminals of the transistor 909 are coupled to the resistors 921, 960, the diodes 924, 930, 957, the capacitor 929, and the transistor 963. The control terminal of the transistor 909 is coupled to transistor 912, the resistor 921, and the diode 924. The diode 909A couples the first terminal of the transistor 909 to the second and third terminals of the transistor 909. The diode 909B couples the second and third terminals of the transistor 909 to a package substrate of the die that implements the transistor 909.

The transistor 912 has a first terminal, a second terminal, a third terminal, and a control terminal. Also, the transistor 912 has a first body diode 912A and a second body diode 912B, which are illustrative examples of diodes formed by implementing the transistor 912 in a die. The first terminal of the transistor 912 is coupled to the transistor 909, the resistor 921, and the diode 924. The second and third terminals of the transistor 912 are coupled to the transistor 915. The control terminal of the transistor 912 is coupled to the transistor 655 and the inverters 990, 993. The diode 912A couples the first terminal of the transistor 912 to the second and third terminals of the transistor 912. The diode 912B couples the first terminal of the transistor 912 to a package substrate of the die that implements the transistor 912.

The transistor 915 has a first terminal, a second terminal, a third terminal, and a control terminal. Also, the transistor 915 has a body diode 915A, which is an illustrative example of a diode formed by implementing the transistor 915 in a die. The first terminal of the transistor 915 is coupled to the transistor 912. The second and third terminals of the transistor 915 are coupled to the second supply terminal of the constant slew rate driver circuitry 900, which supplies the common potential. The control terminal of the transistor 915 is coupled to the logic device 918. The diode 915A couples the first terminal of the transistor 915 to the second and third terminals of the transistor 915.

The logic device 918 has a first input terminal, a second input terminal, and an output terminal. The first input terminal of the logic device 918 is coupled to an output enable terminal, which supplies an output enable (EN_D-OUT). The second input terminal of the logic device 918 is coupled to the inverted high-side protection signal from the high-side voltage protection circuitry 610. The output terminal of the logic device 918 is coupled to the transistor 915. In the example of FIG. 9A, the logic device 918 is an AND gate. Alternatively, the logic device 918 may be removed or replaced with alternative logic circuitry.

The resistor 921 has a first terminal and a second terminal. The first terminal of the resistor 921 is coupled to the transistors 909, 963, the diodes 924, 930, 957, the capacitor 929, and the resistor 960. The second terminal of the resistor 921 is coupled to the transistors 909, 912 and the diode 924.

The diode 924 has a first terminal and a second terminal. The first terminal of the diode 924 is coupled to the transistors 909, 963, the resistors 921, 960, the capacitor 929, and the diodes 924, 930, 957. The second terminal of the diode 924 is coupled to the transistors 909, 912 and the resistor 921. In the example of FIG. 9A, the diode 924 is a Zener diode.

The capacitor 929 has a first terminal and a second terminal. The first terminal of the capacitor 929 is coupled to the transistors 909, 963, the resistors 921, 960, and the diodes 924, 930, 957. The second terminal of the capacitor 929 is coupled to the diode 930 and the transistors 933, 939.

The diode 930 has a first terminal and a second terminal. The first terminal of the diode 930 is coupled to the transistors 909, 963, the resistors 921, 960, the diodes 924, 957, and the capacitor 929. The second terminal of the diode 930 is coupled to the capacitor 929 and the transistors 933, 939. In the example of FIG. 9A, the diode 930 is a Zener diode.

The transistor 933 has a first terminal, a second terminal, a third terminal, and a control terminal. Also, the transistor 933 has a body diode 933A, which is an illustrative example of a diode formed by implementing the transistor 933 in a die. The first terminal of the transistor 933 is coupled to the capacitor 929, the diode 930, and the transistor 939. The second and third terminals of the transistor 933 are coupled to the second supply terminal of the constant slew rate driver circuitry 900, which supplies the common potential. The control terminal of the transistor 933 is coupled to the logic device 936. The diode 933A couples the first terminal of the transistor 933 to the second and third terminals of the transistor 933.

The logic device 936 has a first input terminal, a second input terminal, and an output terminal. The first input terminal of the logic device 936 is coupled to the input terminal of the constant slew rate driver circuitry 900, which supplies the digital input signal. The second input terminal of the logic device 936 is coupled to the high-side voltage protection circuitry 610, which supplies the inverted high-side protection signal. In the example of FIG. 9A, the logic device 936 is an AND gate. Alternatively, the logic device 936 may be removed or replaced with alternative logic circuitry.

The transistor 939 has a first terminal, a second terminal, a third terminal, and a control terminal. Also, the transistor 939 has a body diode 939A, which is an illustrative example of a diode formed by implementing the transistor 939 in a die. The first terminal of the transistor 939 is coupled to the capacitor 929, the diode 930, and the transistor 933. The second and third terminals of the transistor 939 are coupled to the resistor 942, the diode 945, and the transistor 948. The control terminal of the transistor 939 is coupled to the resistor 942, the diode 945, and the transistors 948, 951. The diode 939A couples the first terminal of the transistor 939 to the second and third terminals of the transistor 939.

The resistor 942 has a first terminal and a second terminal. The first terminal of the resistor 942 is coupled to the transistors 939, 948 and the diode 945. The second terminal of the resistor 942 is coupled to the transistors 939, 948, 951 and the diode 945.

The diode 945 has a first terminal and a second terminal. The first terminal of the diode 945 is coupled to the transistors 939, 948 and the resistor 942. The second terminal of the diode 945 is coupled to the transistors 939, 948, 951 and the resistor 942. In the example of FIG. 9A, the diode 945 is a Zener diode.

The transistor 948 has a first terminal, a second terminal, a third terminal, and a control terminal. Also, the transistor 948 has a body diode 948A, which is an illustrative example of a diode formed by implementing the transistor 948 in a die. The first terminal of the transistor 948 is coupled to the high-side voltage protection circuitry 610, which supplies the internal supply voltage. The second and third terminals of the transistor 948 are coupled to the transistor 939, the resistor 942, and the diode 945. The control terminal of the transistor 948 is coupled to the transistors 939, 951, the resistor 942, and the diode 945. The diode 948A couples the first terminal of the transistor 948 to the second and third terminals of the transistor 948.

The transistor 951 has a first terminal, a second terminal, a third terminal, and a control terminal. Also, the transistor 951 has a body diode 951A, which is an illustrative example of a diode formed by implementing the transistor 951 in a die. The first terminal of the transistor 951 is coupled to the transistors 939, 948, the resistor 942, and the diode 945. The second and third terminals of the transistor 951 are coupled to the second supply terminal of terminal of the transistor 951 is coupled to the logic device 954. The diode 951A couples the first terminal of the transistor 951 to the second and third terminals of the transistor 951.

The logic device 954 has a first input terminal, a second input terminal, and an output terminal. The first input terminal of the logic device 954 is coupled to the inverter 635, which supplies the inverted digital input signal. The second input terminal of the logic device 954 is coupled to the high-side voltage protection circuitry 610, which supplies the inverted high-side protection signal. The output terminal of the logic device 954 is coupled to the transistor 951. In the example of FIG. 9A, the logic device 954 is an AND gate. Alternatively, the logic device 954 may be removed or replaced with alternative logic circuitry.

The diode 957 has a first terminal and a second terminal. The first terminal of the diode 957 is coupled to the transistors 909, 963, the resistors 921, 960, the diodes 924, 930, and the capacitor 929. The second terminal of the diode 957 is coupled to the resistor 960 and the transistors 963, 966. In the example of FIG. 9A, the diode 957 is a Zener diode.

The resistor 960 has a first terminal and a second terminal. The first terminal of the resistor 960 is coupled to the transistors 909, 963, the resistor 921, the diodes 924, 930, 957, and the capacitor 929. The second terminal of the resistor 960 is coupled to the diode 957 and the transistors 963, 966.

The transistor 963 has a first terminal, a second terminal, a third terminal, and a control terminal. Also, the transistor 963 has a body diode 963A, which is an illustrative example of a diode formed by implementing the transistor 963 in a die. The first terminal of the transistor 963 is coupled to the high-side voltage protection circuitry 610, which supplies the internal supply voltage. The second and third terminals of the transistor 963 are coupled to the transistor 909, the resistors 921, 960, the diodes 924, 930, 957, and the capacitor 929. The control terminal of the transistor 963 is coupled to the diode 957, the resistor 960, and the transistor 966. The diode 963A couples the first terminal of the transistor 963 to the second and third terminals of the transistor 963.

The transistor 966 has a first terminal, a second terminal, a third terminal, and a control terminal. Also, the transistor 966 has a body diode 966A, which is an illustrative example of a diode formed by implementing the transistor 966 in a die. The first terminal of the transistor 966 is coupled to the diode 957, the resistor 960, and the transistor 963. The second and third terminals of the transistor 966 are coupled to the second supply terminal of terminal of the transistor 966 is coupled to the logic device 969. The diode 966A couples the first terminal of the transistor 966 to the second and third terminals of the transistor 966.

The logic device 969 has a first input terminal, a second input terminal, and an output terminal. The first input terminal of the logic device 969 is coupled to the input terminal of the constant slew rate driver circuitry 900, which supplies the digital input signal. The second input terminal of the logic device 969 is coupled to the high-side voltage protection circuitry 610, which supplies the inverted high-side protection signal. The output terminal of the logic device 969 is coupled to the transistor 966.

The resistor 972 has a first terminal and a second terminal. The first terminal of the resistor 972 is coupled to the output terminal of the constant slew rate driver circuitry 900, which supplies the output voltage. The second terminal of the resistor 972 is coupled to the transistor 975 and the diode 981.

The transistor 975 has a first terminal, a second terminal, a third terminal, and a control terminal. Also, the transistor 975 has a body diode 975A, which is an illustrative example of a diode formed by implementing the transistor 975 in a die. The first terminal of the transistor 975 is coupled to the second supply terminal of the constant slew rate driver circuitry 900, which supplies the common potential. The second terminal of the transistor 975 is coupled to the high-side voltage protection circuitry 610, which supplies internal supply voltage. The third terminal of the transistor 975 is coupled to the resistor 984 and the transistor 987. The control terminal of the transistor 975 is coupled to the resistor 972. The diode 975A couples the second terminal of the transistor 975 to the third terminal of the transistor 975.

The diode 978 has a first terminal and a second terminal. The first terminal of the diode 978 is coupled to the second supply terminal of the constant slew rate driver circuitry 900, which supplies the common potential. The second terminal of the diode 978 is coupled to the diode 981. In the example of FIG. 9A, the diode 978 is a Zener diode.

The diode 981 has a first terminal and a second terminal. The first terminal of the diode 981 is coupled to the resistor 972 and the transistor 975. The second terminal of the diode 981 is coupled to the diode 978. In the example of FIG. 9A, the diode 981 is a Zener diode.

The resistor 984 has a first terminal and a second terminal. The first terminal of the resistor 984 is coupled to the high-side voltage protection circuitry 610, which supplies the internal supply voltage. The second terminal of the resistor 984 is coupled to the transistors 975, 987.

The transistor 987 has a first terminal, a second terminal, and a control terminal. The first terminal of the transistor 987 is coupled to the resistor 988 and the inverter 990. The second terminal of the transistor 987 is coupled to the second supply terminal of the constant slew rate driver circuitry 900, which supplies the common potential. The control terminal of the transistor 987 is coupled to the transistor 975 and the resistor 984.

The resistor 988 has a first terminal and a second terminal. The first terminal of the resistor 988 is coupled to the high-side voltage protection circuitry 610, which supplies the internal supply voltage. The second terminal of the resistor 988 is coupled to the transistor 987 and the inverter 990.

The inverter 990 has a first terminal, a second terminal, a third terminal, and a fourth terminal. The first terminal of the inverter 990 (also referred to as an input terminal) is coupled to the transistor 987 and the resistor 988. The second terminal of the inverter 990 (also referred to as an output terminal) is coupled to the transistors 655, 912 and the inverter 993. The third terminal of the inverter 990 is coupled to the high-side voltage protection circuitry 610, which supplies the internal supply voltage. The fourth terminal of the inverter 990 is coupled to the second supply terminal of the constant slew rate driver circuitry 900, which supplies the common potential.

The inverter 993 has a first terminal and a second terminal. has a first terminal, a second terminal, a third terminal, and a fourth terminal. The first terminal of the inverter 993 (also referred to as an input terminal) is coupled to the transistors 655, 912 and the inverter 990. The second terminal of the inverter 993 (also referred to as an output terminal) is coupled to the transistors 625, 650 by the level shifter circuitry 996. The third terminal of the inverter 993 is coupled to the high-side voltage protection circuitry 610, which supplies the internal supply voltage. The fourth terminal of the inverter 993 is coupled to the second supply terminal of the constant slew rate driver circuitry 900, which supplies the common potential.

The level shifter circuitry 996 has a first terminal and a second terminal. The first terminal of the level shifter circuitry 996 is coupled to the inverter 993. The second terminal of the level shifter circuitry 996 is coupled to the transistors 625, 650.

In the example of FIGS. 9A and 9B, the transistors 655, 660, 670, 912, 915, 933, 951, 966, 987 are n-channel MOSFETs. Alternatively, the transistors 655, 660, 670, 912, 915, 933, 951, 966, 987 may be n-channel FETs, n-channel IGBTs, n-channel JFETs, NPN BJTs or, with slight modifications, p-type equivalent devices. In the example of FIGS. 9A and 9B, the transistors 605, 615, 650, 909, 939, 948, 963,

975 are p-channel MOSFETs. Alternatively, the transistors 605, 615, 650, 909, 939, 948, 963, 975 may be p-channel FETs, p-channel IGBTs, p-channel JFETs, PNP BJTs, or, with slight modifications, N-type equivalent devices. The transistors 605, 615, 650, 655, 660, 670, 909, 912, 915, 933, 939, 948, 951, 963, 966, 975, 987 may be depletion mode devices, drain-extended devices, enhancement mode devices, natural transistors or other type of device structure transistors. Furthermore, the transistors 605, 615, 650, 655, 660, 670, 909, 912, 915, 933, 939, 948, 951, 963, 966, 975, 987 may be implemented in/over a silicon substrate (Si), a silicon carbide substrate (SiC), a gallium nitride substrate (GaN) or a gallium arsenide substrate (GaAs).

FIG. 10 is a flowchart representative of example operations 1000 that may be at least one of executed, instantiated, or performed using an example implementation of the low-side voltage protection circuitry 665, 903 of FIGS. 6, 9A, and 9B, or more generally, the constant slew rate driver circuitry 600, 900 of FIGS. 6, 9A, and 9B. The example operations 1000 of FIG. 10 begin by performing the operations 800 of FIG. 8, at which the high-side voltage protection circuitry 610, 705 controls high-side transistors responsive to an internal supply voltage and a high-side protection voltage. (Operations 800).

The transistor 975 of FIG. 9A determines if the output voltage is less than a negative threshold voltage. (Block 1005). In example operations, the resistor 972 of FIG. 9A sets the control terminal of the transistor 975 to a voltage that is proportional to the output voltage at the output terminal of the constant slew rate driver circuitry 600, 900. In such example operations, the transistor 975 turns on responsive to the output voltage being approximately equal to a threshold voltage of the transistor 975 less than the common potential of the second supply terminal of the constant slew rate driver circuitry 600, 900.

If the transistor 975 determines that the output voltage is greater than a negative threshold voltage (e.g., Block 1005 returns a result of NO), the inverters 990, 993 of FIG. 9A set a low-side protection signal to a logic low. (Block 1010). In example operations, the transistor 975 remains off responsive to the output voltage being greater than the common potential minus the threshold voltage of the transistor 975. In such example operations, the resistor 984 of FIG. 9A pulls the control terminal of the transistor 987 of FIG. 9A to the internal supply voltage from the high-side protection circuitry 610, 705. The transistor 987 turns on responsive to the resistor 984 pulling up the control terminal, which allows the transistor 987 to pull down the input terminal of the inverter 990. The inverter 990 sets an inverted low-side protection signal to a logic high responsive to the transistor 987 pulling down the input terminal. The inverter 993 sets a low-side protection signal to a logic low responsive to the inverter 990 setting the inverted low-side protection signal to a logic high. Advantageously, the low-side protection signal is a logic low when the output voltage is greater than the common potential minus a threshold voltage.

If the transistor 975 determines that the output voltage is less than a negative threshold voltage (e.g., Block 1005 returns a result of YES), the inverters 990, 993 set the low-side protection signal to a logic high. (Block 1015). In example operations, the transistor 975 turns on responsive to the output voltage being more than the threshold voltage of the transistor 975 less than the common potential. In such example operations, the transistor 975 pulls the control terminal of the transistor 987 to the common potential. The transistor 987 turns off responsive to the transistor 975 pulling down the control terminal, which allows the resistor 988 of FIG. 9A to pull up the input terminal of the inverter 990. The inverter 990 sets the inverted low-side protection signal to a logic low responsive to the resistor 988 pulling up the control terminal. The inverter 993 sets the low-side protection signal to a logic high responsive to the inverter 990 setting the inverted low-side protection signal to a logic low. Advantageously, the low-side protection signal is a logic high when the output voltage is a threshold voltage less than the common potential.

The inverters 990, 993 disconnect the high-side and low-side control terminals. (Block 1020). In some examples, the inverters 990, 993 turn off the transistors 650, 655 responsive to the output voltage being a threshold voltage less than the common potential. In such examples, the inverter 990 generates the inverted low-side protection signal having a logic low state and the inverter 993 generates the low-side protection signal having a logic high state. The transistor 650 turns off responsive to the low-side protection signal having a logic high state and the transistor 655 turns off responsive to the inverted high-side protection signal having a logic low state. Also, in some examples, the level shifter circuitry 996 of FIG. 9A shifts (e.g., offsets) the logic levels of the low-side protection signal from first logic levels (e.g., zero to five volts) to shifted logic levels (e.g., the protection supply voltage minus five volts to the protection supply voltage). In such examples, the level shifter circuitry 996 uses the shifted logic levels to control the transistor 650 and 625.

The transistor 625 of FIGS. 6, 7, and 9B pulls up a high-side control terminal to disable a high side transistor. (Block 1025). In some examples, the low-side protection signal from the inverter 993 turns on the transistor 625 responsive to being in a logic high state. In some such examples, the level shifter circuitry 996 shifts the logic level of the low-side protection signal to be in relation to the protection supply voltage, which ensures that the transistor 625 is turned on. In example operations, the transistor 625 prevents the transistor 615 from being turned on responsive to setting the control terminal of the transistor 615 equal to the protection supply voltage. Advantageously, the low-side voltage protection circuitry 665, 903 disables the transistor 615 responsive to detecting an unsafe output voltage at the output terminal of the constant slew rate driver circuitry 600, 700, 900.

The transistor 680 of FIGS. 6, 7, and 9B pulls down a first low-side control terminal to disable a first low-side transistor. (Block 1030). In some examples, the low-side protection signal from the inverter 993 turns on the transistor 680 responsive to being in a logic high state. In example operation, the transistor 680 prevents the transistor 670 from being turned on responsive to setting the control terminal of the transistor 670 equal to the common potential. Advantageously, the low-side voltage protection circuitry 665, 903 disables the transistor 670 responsive to detecting an unsafe output voltage. Control proceeds to return to Block 1005.

The logic devices 918, 936, 954, 969 of FIG. 9A determine if the high-side protection is active. (Block 1035). In example operations, the logic devices 918, 936, 954, 969 receive the inverted high-side protection signal from the high-side voltage protection circuitry 610, 705, which is a logical inverse of the high-side protection signal. The inverted high-side protection signal represents the high-side protection as active as a logical zero. In such example operations, the logic devices 918, 936, 954, 969 are AND gates that the inverted high-side protection signal holds in one state when the high-side protection is active. Also, the logic devices 918, 936, 954, 969 generate outputs that follow the data input signal responsive to the inverted high-side protection signal indicating that the high-side protection is not active.

If the logic devices 918, 936, 954, 969 determine that the high-side protection is active (e.g., Block 1035 returns a result of YES), the logic devices 918, 936, 954, 969 disable charge pump circuitry. (Block 1040). In example operations, the inverted high-side protection signal prevents the outputs of the logic devices 918, 936, 954, 969 from following the digital input signal when the high-side protection is active. In such example operations, the outputs of the logic device 918, 936, 954, 969 prevent switching of the transistors 909, 915, 933, 939, 948, 951, 963, 966 of FIG. 9A, which disables charge boosting of the capacitor 929 of FIG. 9. In some examples, and as further described below, the transistors 909, 915, 933, 939, 948, 951, 963, 966 functionally implement charge pump circuitry to boost a voltage across the capacitor 929 to a voltage greater than the internal supply voltage. Advantageously, disabling the transistors 909, 915, 933, 939, 948, 951, 963, 966 responsive to the high-side voltage protection circuitry 610, 705 prevents the unsafe voltage from being coupled to the common potential or the internal supply voltage. Control proceeds to return to Block 1035.

If the logic devices 918, 936, 954, 969 determine that the high-side protection is not active (e.g., Block 1035 returns a result of NO), the diodes 615B, 660B, 909B, 912B of FIGS. 9A and 9B determine if the protection supply voltage is less than a maximum negative voltage. (Block 1045). When the supply voltage of the constant slew rate driver circuitry 600, 900 is set to a negative voltage, the voltage of the package substrate, which remains at the common potential, becomes the highest voltage in the constant slew rate driver circuitry 600, 900. For example, the supply voltage of the constant slew rate driver circuitry 600, 900 is negative if either the second supply terminal or the output terminal of the constant slew rate driver circuitry 600, 900 are set to a voltage greater than the supply voltage at the first supply terminal. During such example operations, the negative voltage forward biases the diodes 615B, 660B, 909B, 912B, which prevents the transistors 605, 615, 660, 670 from being accurately controlled by the voltage protection circuitry 610, 665, 705, 903.

If the diodes 615B, 660B, 909B, 912B determine that the protection supply voltage is less than a maximum negative voltage (e.g., Block 1045 returns a result of YES), the resistor 906 of FIG. 9A turns off a second low-side transistor. (Block 1050). In example operations, when the diodes 615B, 660B, 909B, 912B are forward biased by unsafe negative voltages, the diodes 909B, 912B set the gate-to-source voltage of the transistor 909 approximately equal to zero. In such example operations, the diode 912B reverse biases the diode 912A, which reduces the voltage drop across the resistor 906 and sets the gate-to-source voltage of the transistor 660 approximately equal to zero. Advantageously, the resistor 906 disables the transistor 660 responsive to an unsafe negative voltage at the second supply terminal or the output terminal of the constant slew rate driver circuitry 600, 900. Control proceeds to return to Block 1045.

If the diodes 615B, 660B, 909B, 912B determine that the protection supply voltage is greater than a maximum negative voltage (e.g., Block 1045 returns a result of NO), the logic devices 918, 936, 954, 969 determine if the data is a logic high. (Block 1055). In example operations, the outputs of the logic devices 918, 936, 954, 969 follow one of the digital input signal or the inverted digital input signal when the inverted high-side protection signal is a logic high.

If the logic devices 936, 969 determine that the digital input signal is a logic high and the logic device 954 determines that the inverted digital input signal is a logic low (e.g., Block 1055 returns a result of YES), the transistors 933, 963 charge a capacitor of the charge pump circuitry to the internal supply voltage. (Block 1060). In some examples, the transistors 933, 966 turn on and the transistors 939, 948 of FIG. 9A turn off responsive to transistor 951 turning off, which sets the voltage drop across the resistor 942. In such example operations, the transistor 963 couples the first terminal of the capacitor 929 to the internal supply voltage responsive to the transistor 966 creating a voltage drop across the resistor 960. Also, the transistor 933 couples the capacitor 929 to the common potential. In example operations, the transistors 933, 963 charge the capacitor 929 to have a voltage approximately equal to the internal supply voltage responsive to the digital input signal being a logic high. Control proceeds to return to the operations 800.

If the logic devices 936, 969 determine that the digital input signal is not a logic high, and the logic device 954 determines that the inverted digital input signal is a logic high (e.g., Block 1055 returns a result of NO), the logic devices936, 969 determine if the data is a logic low (e.g., the logic device 954 determines that the inverted data is a logic high). (Block 1065). In example operations, the outputs of the logic devices 936, 954, 969 follow one of the digital input signal or the inverted digital input signal when the inverted high-side protection signal is a logic high. If the logic devices 936, 969 determine the digital input signal is not a logic low, and logic device 954 determines the inverted digital input signal is not a logic high (e.g., Block 1065 returns a result of NO), control proceeds to return to the operations 800.

If the logic devices 936, 969 determine that the digital input signal is a logic low and the logic device 954 determine the inverted digital input signal is a logic high (e.g., Block 1065 returns a result of YES), the transistors 909, 939, 948, 951 turn on the second low-side transistor by boosting the voltage of the capacitor of the charge pump circuitry. (Block 1070). In example operations, when the digital input signal is a logic low and the inverted digital input signal is a logic high, the logic devices 936, 969 turn off the transistors 933, 966. In such example operations, the transistors 939, 948 turn on responsive to the transistor 951 creating a voltage drop across the resistor 942. The transistors 939, 948 couple the second terminal of the capacitor 929 to the internal supply voltage, which sets the control terminal of the transistor 660 approximately equal to two times the internal supply voltage. Such a voltage boost across the capacitor 929 is responsive to the existing potential across the capacitor 929 from Block 1055. Advantageously, the switching of the transistors 933, 951, 966 allows the low-side voltage protection circuitry 665, 903 to turn on the transistor 660 despite the output voltage being approximately equal to the internal supply voltage. Control proceeds to return to the operations 800.

Although example methods are described with reference to the flowchart illustrated in FIG. 10, many other methods of implementing the low-side voltage protection circuitry 665, 903 or more generally the constant slew rate driver circuitry 600, 900 of FIGS. 6, 9A, and 9B may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 11:
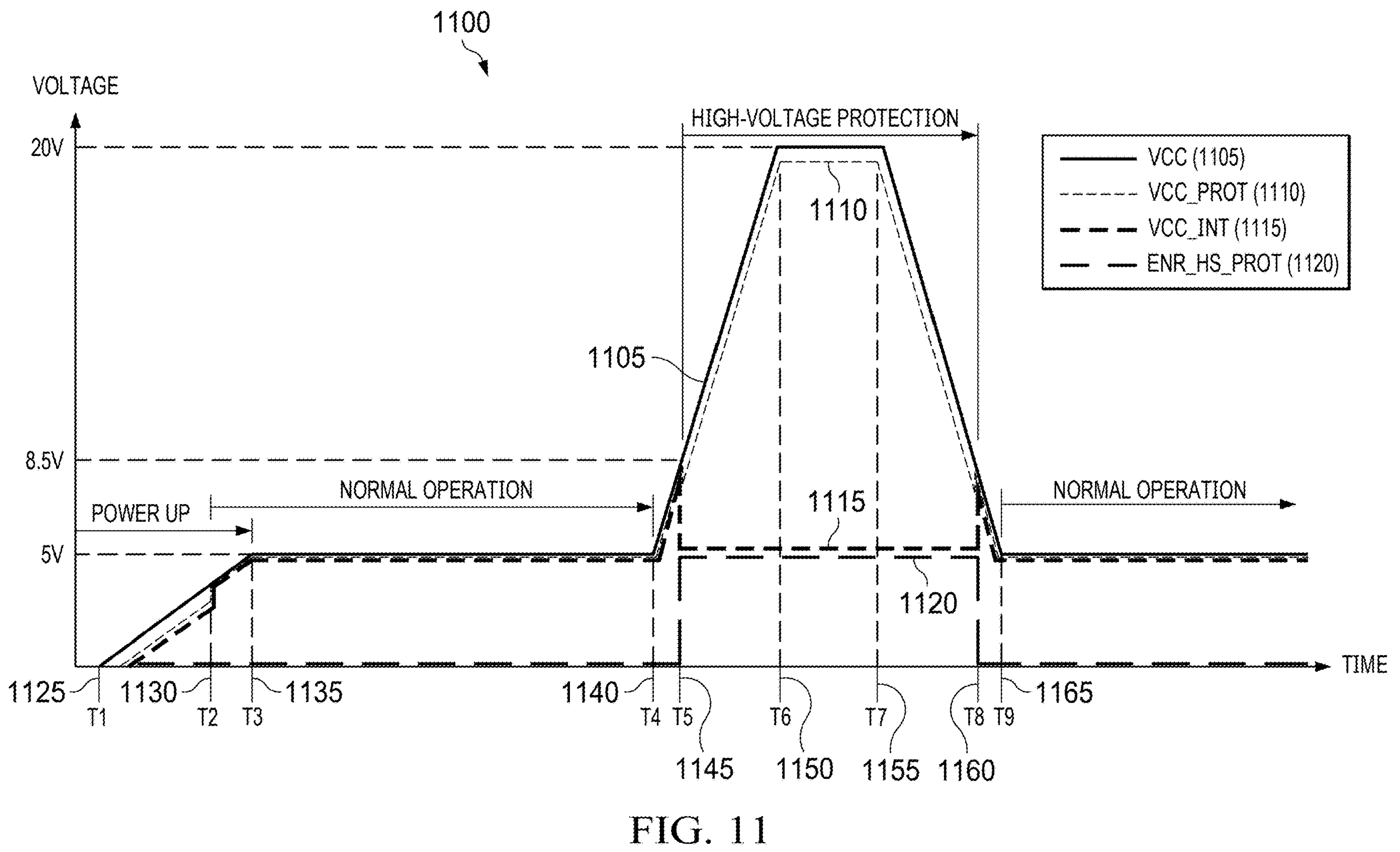
FIG. 11 is a timing diagram of example operations of the constant slew rate driver circuitry of FIGS. 1 and 6 including example operations of the high and low side voltage protection circuitry of FIGS. 6, 7, 9A, and 9B.

FIG. 11 is a timing diagram 1100 of the example operations 800 of FIG. 8 of the high-side voltage protection circuitry 610, 705 of FIGS. 6 and 7, or more generally the constant slew rate driver circuitry 140, 600, 700, 900 of FIGS. 1, 6, 7, 9A, and 9B. In the example of FIG. 11, the timing diagram 1100 illustrates an example supply voltage 1105 (VCC), an example protection supply voltage 1110 (VCC_PROT), an example internal supply voltage 1115 (VCC_INT), and an example high-side protection signal 1120 (ENR_HS_PROT) over time.

The supply voltage 1105 represents the voltage at the first supply terminal of the constant slew rate driver circuitry 140, 600, 700, 900. The protection supply voltage 1110 represents a voltage at the protection supply terminal of the high-side voltage protection circuitry 610, 705. The internal supply voltage 1115 represents a voltage at the internal supply terminal of the high-side voltage protection circuitry 610, 705. The high-side protection signal 1120 represents whether the high-side voltage protection circuitry 610, 705 is actively protecting the constant slew rate driver circuitry 600, 700, 900 from unsafe voltages. In the example of FIG. 7, the high-side voltage protection circuitry 610, 705 is actively protecting the constant slew rate driver circuitry 600, 700, 900 responsive to the high-side protection signal 1120 being equal to a logic high (e.g., five volts).

At a first time 1125, the device 110 of FIG. 1 begins to power-up and the supply voltage 1105 begins to increase. Such example operations correspond to the operations of Blocks 805, 810 of FIG. 8, above. After the first time 1125, the protection supply voltage 1110 and the internal supply voltage 1115 begin to increase responsive to the supply voltage 1105 forward biasing the diode 605B of FIGS. 6, 7, and 9B. Such example operations correspond to Blocks 815, 820 of FIG. 8, above. At a second time 1130, the high-side voltage protection circuitry 610, 705 turns on the transistor 605 of FIGS. 6, 7, and 9B, which regulates the protection supply voltage 1110 to be approximately equal to the supply voltage 1105. Such example operations correspond to Block 840 of FIG. 8 above. Also, between the first time 1125 and a third time 1135, the high-side voltage protection circuitry 610, 705 performs the operations of Blocks 825, 830, 835 of FIG. 8. After the third time 1135, the current source circuitry 630, 685 of FIGS. 6, 7, and 9B drive the transistors 615, 670 of FIGS. 6, 7, and 9B to generate and output that has a slew rate that is independent of the capacitance of coupled to the output terminal (e.g., the capacitors 280, 695 of FIGS. 2, 6, 7, and 9B). Such example operations are illustrated and described in connection with the operations 300 of FIG. 3.

At a fourth time 1140, the supply voltage 1105, the protection supply voltage 1110, and the internal supply voltage 1115 begin to increase. In example operation, shortly after the fourth time 1140, the supply voltage 1105 is shortened to a high voltage (e.g., twenty volts). At a fifth time 1145, the protection supply voltage 1110 increases to a voltage greater than the threshold voltage of Block 845 of FIG. 8. At the fifth time 1145, the transistor 745 of FIG. 7 turns off and the transistor 750 of FIG. 7 turns on, which clamps the internal supply voltage 1115 to approximately five volts. Also, at the fifth time 1145, the inverters 760, 765 of FIG. 7 set the high-side protection signal 1120 to a logic high, which causes the operations of Blocks 855, 860, 865 of FIG. 8. At a sixth time 1150, the supply voltage 1105 and the protection supply voltage 1110 stop increasing. At a seventh time 1155, the supply voltage 1105 and the protection supply voltage 1110 begin to decrease.

At an eighth time 1160, the supply voltage 1105 and the protection supply voltage 1110 become less than the threshold voltage of Block 845. At the eighth time 1160, the transistor 745 turns on and the transistor 750 turns off, which sets the internal supply voltage 1115 approximately equal to the protection supply voltage 1110. Also, at the eighth time 1160, the inverters 760, 765 set the high-side voltage protection signal 1120 to a logic low, which allows the current source circuitry 630, 685 to return to driving the transistors 615, 670. After a ninth time 1165, the current source circuitry 630, 685 continue to drive the transistors 615, 670.

Figure 12:
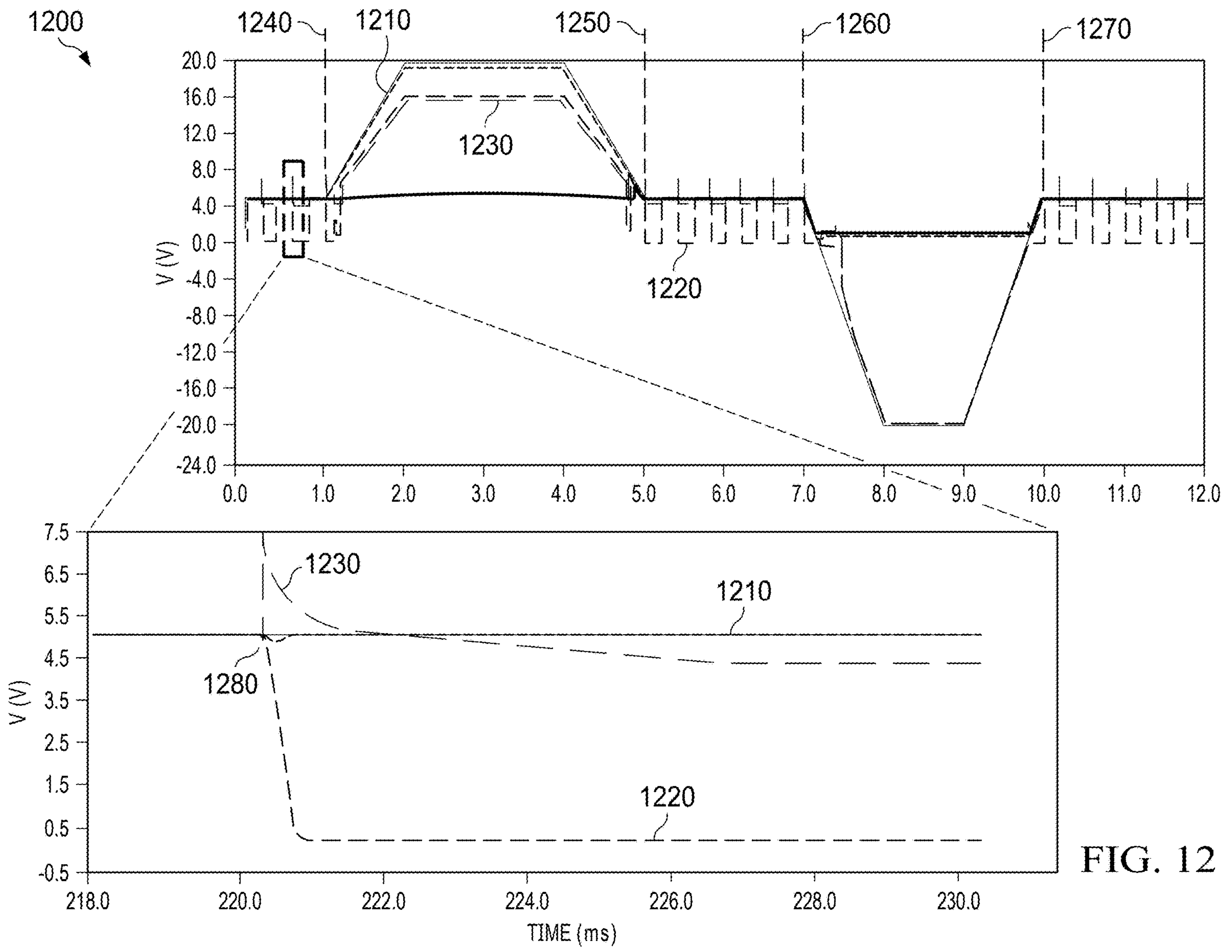
FIG. 12 is another timing diagram of example operations of the constant slew rate driver circuitry of FIGS. 1 and 6 including example operations of the high and low side voltage protection circuitry of FIGS. 6, 7, 9A, and 9B.

FIG. 12 is a timing diagram 1200 of example operations 800, 1000 of FIGS. 8 and 10 of the constant slew rate driver circuitry 140, 600, 700, 900 of FIGS. 1, 6, 7, 9A, and 9B. In the example of FIG. 12, the timing diagram 1200 illustrates an example supply voltage 1210 (VCC), an example output voltage 1220 (VOUT), and an example low-side control voltage 1230. The supply voltage 1210 represents the voltage at the first supply terminal of the constant slew rate driver circuitry 140, 600, 700, 900. The output voltage 1220 represents a voltage at the output terminal of the constant slew rate driver circuitry 140, 600, 700. The low-side control voltage 1230 represents the voltage of the control terminal of the transistor 660 of FIGS. 6, 7, and 9B.

At a first time 1240, the supply voltage 1210, the output voltage 1220, and the low-side control voltage 1230 begin to increase. Between the first time 1240 and a second time 1250, the supply voltage 1210, the output voltage 1220, and the low-side control voltage 1230 increase beyond the threshold voltage of Block 845 of FIG. 8. During such example operations, the high-side voltage protection circuitry 610, 705 sets the high-side voltage protection signal (e.g., the high-side voltage protection signal 1120 of FIG. 11) and clamps the internal supply voltage (e.g., the internal supply voltage 1115 of FIG. 11). The inverted high-side protection signal turns off the transistors 915, 933, 951, 966 of FIG. 9A to allow the resistor 906 to turn off the transistor 660. Advantageously, the low-side control voltage 1230 may be coupled to relatively high voltages without turning on the transistor 660.

Between the second time 1250 and a third time 1260, the constant slew rate driver circuitry 140, 600, 700, 900 returns to normal operations. At the third time 1260, the supply voltage 1210, the output voltage 1220, and the low-side control voltage 1230 decrease to a voltage less than a threshold below the common potential (e.g., OV). During such example operations, the low-side voltage protection circuitry 665, 903 sets the low-side protection signal to perform the operations of Blocks 1015, 1020, 1025, 1030 of FIG. 10. After a fourth time 1270, the constant slew rate driver circuitry 140, 600, 700, 900 returns to normal operation.

At a fifth time 1280, which occurs during the normal operations of the constant slew rate driver circuitry 140, 600, 700, 900, the output voltage 1220 has a falling edge. During such example operations, the transistor 615 begins to turn off and the transistors 660, 670 turn on. However, when the output voltage 1220 is approximately equal to the internal supply voltage (e.g., the internal supply voltage 1115 of FIG. 11), the low-side control voltage 1230 needs to be boosted to turn on the transistor 660. At the fifth time 1280, the transistors 909, 915, 933, 951, 966, 963 of FIG. 9A boost the voltage across the capacitor 929 of FIG. 9A to increase the low-side control voltage 1230 to a voltage that is capable of turning on the transistor 660. Such example operations correspond to Block 1070 of FIG. 10 and are responsive to the transition from the digital input signal from a logic high to a logical zero. Advantageously, boosting the voltage across the capacitor 929 allows the transistor 660 to be a p-channel transistor.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and things, the phrase "at least one of A and B" refers to implementations including any of (1) at least one A, (2) at least one B, or (3) at least one A and at least one B. Similarly, as used herein in the context of describing structures, components, items, objects and things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is at least one of not feasible or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by at least one of the connection reference or relative movement between those elements unless otherwise indicated. As such, connection references do not necessarily infer that two elements are directly connected or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, or ordering in any way, but are merely used as at least one of labels or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to at least one of manufacturing tolerances or other real-world imperfections. For example, "approximately" and "about" may indicate such dimensions may be within a tolerance range of +/−10% unless otherwise specified herein.

As used herein "substantially real time" refers to occurrence in a near instantaneous manner recognizing there may be real world delays for computing time, transmission, etc. Thus, unless otherwise specified, "substantially real time" refers to real time+1 second.

As used herein, the phrase "in communication," including variations thereof, encompasses one of or a combination of direct communication or indirect communication through one or more intermediary components, and does not require direct physical (e.g., wired) communication or constant communication, but rather also includes selective communication at least one of periodic intervals, scheduled intervals, aperiodic intervals, or one-time events.

As used herein, "programmable circuitry" is defined to include at least one of (i) one or more special purpose electrical circuits (e.g., an application specific circuit (ASIC)) structured to perform specific operation(s) and including one or more semiconductor-based logic devices (e.g., electrical hardware implemented by one or more transistors), or (ii) one or more general purpose semiconductor-based electrical circuits programmable with instructions to perform one or more specific functions(s) or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations or functions, Field Programmable Gate Arrays (FPGAs) that may be programmed with second instructions to at least one of configure or structure the FPGAs to instantiate one or more operations or functions corresponding to the first instructions, Graphics Processor Units (GPUs) that may execute first instructions to perform one or more operations or functions, Digital Signal Processors (DSPs) that may execute first instructions to perform one or more operations or functions, XPUs, Network Processing Units (NPUs) one or more microcontrollers that may execute first instructions to perform one or more operations or functions or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., at least one of programmed or hardwired) at a time of manufacturing by a manufacturer to at least one of perform the function or be configurable (or re-configurable) by a user after manufacturing to perform the function/or other additional or alternative functions. The configuring may be through at least one of firmware or software programming of the device, through at least one of a construction or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as voltage and/or current sources) may instead include only the semiconductor elements within a single physical device (e.g., at least one of a semiconductor die or integrated circuit (IC) package) and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

What is claimed is:

1. An apparatus comprising:

current source circuitry having a first terminal and a second terminal;

current sink circuitry having a first terminal and a second terminal;

a first transistor having a first terminal, a second terminal, and a control terminal, the first terminal of the first transistor coupled to the first terminal of the current source circuitry;

a second transistor having a first terminal, a second terminal, and a control terminal, the first terminal of the second transistor coupled to the first terminal of the current sink circuitry;

a capacitor having a first terminal and a second terminal, the first terminal of the capacitor coupled to the second terminal of the first transistor and the second terminal of the second transistor, the second terminal of the capacitor coupled to the second terminal of the current source circuitry, the second terminal of the current sink circuitry, the control terminal of the first transistor, and the control terminal of the second transistor; and wherein the first and second transistors are configured to produce a shoot-through current during switching of the first and second transistors.

2. The apparatus of claim 1, further comprising:

a third transistor having a first terminal and a second terminal; and a fourth transistor having a first terminal and a second terminal, the first terminal of the fourth transistor coupled to the second terminal of the current source circuitry, the control terminal of the first transistor, and the first terminal of the third transistor, the second terminal of the fourth transistor coupled to the second terminal of the current sink circuitry, the control terminal of the second transistor, the second terminal of the third transistor, and the second terminal of the capacitor.

3. The apparatus of claim 2, wherein the capacitor is a first capacitor, the third transistor further having a control terminal, and the apparatus further comprising:

a second capacitor having a first terminal and a second terminal, the first terminal of the second capacitor coupled to the second terminal of the first transistor, the second terminal of the second transistor, and the first terminal of the first transistor; and a fifth transistor having a first terminal, a second terminal, and a control terminal, the first terminal of the fifth transistor coupled to the first terminal of the current source circuitry and the first terminal of the first transistor, the second terminal of the fifth transistor is coupled to the second terminal of the current source circuitry, the control terminal of the first transistor, the first terminal of the third transistor, the first terminal of the fourth transistor, and the second terminal of the second capacitor, the control terminal of the fifth transistor coupled to the control terminal of the third transistor.

4. The apparatus of claim 2, wherein the third transistor further having a control terminal, and the apparatus further comprising:

a Zener diode having a first terminal and a second terminal; and a fifth transistor having a first terminal, a second terminal, and a control terminal, the first terminal of the fifth transistor coupled to the first terminal of the current sink circuitry, the first terminal of the second transistor, and the first terminal of the Zener diode, the second terminal of the fifth transistor coupled to the second terminal of the current sink circuitry, the control terminal of the second transistor, the second terminal of the capacitor, and the second terminal of the Zener diode, the control terminal of the fifth transistor coupled to the control terminal of the third transistor.

5. The apparatus of claim 1, further comprising:

a first resistor having a first terminal and a second terminal;

a third transistor having a first terminal and a control terminal, the first terminal of the third transistor is coupled to the first terminal of the current source circuitry, the first terminal of the first transistor, and the first terminal of the first resistor, the control terminal of the third transistor coupled to the second terminal of the first resistor;

a second resistor having a first terminal and a second terminal; and a fourth transistor having a first terminal, a second terminal, and a control terminal, the first terminal of the fourth transistor coupled to the second terminal of the first transistor, the first terminal of the capacitor, and the first terminal of the second resistor, the second terminal of the fourth transistor coupled to the second terminal of the second transistor, the control terminal of the fourth transistor coupled to the second terminal of the second resistor.

6. The apparatus of claim 5, further comprising:

clamp circuitry having a first terminal and a second terminal, the first terminal of the clamp circuitry coupled to the first terminal of the current sink circuitry and the first terminal of the second transistor;

a fifth transistor having a first terminal, a second terminal, and a control terminal, the first terminal of the fifth transistor coupled to the first terminal of the current source circuitry, the first terminal of the first resistor, the first terminal of the first resistor, and the first terminal of the third transistor, the control terminal of the fifth transistor coupled to the second terminal of the clamp circuitry;

a third resistor having a first terminal and a second terminal, the first terminal of the third resistor coupled to the second terminal of the fifth transistor;

an inverter having a first terminal and a second terminal, the first terminal of the inverter coupled to the second terminal of the third resistor; and a sixth transistor having a first terminal and a control terminal, the first terminal of the sixth transistor coupled to the second terminal of the first resistor and the control terminal of the third transistor, the control terminal of the sixth transistor coupled to the second terminal of the inverter.

7. The apparatus of claim 5, further comprising:

charge pump circuitry having a first terminal and a second terminal, the first terminal of the charge pump circuitry coupled to the second terminal of the second resistor and the control terminal of the fourth transistor;

a third resistor having a first terminal and a second terminal, the first terminal of the third resistor coupled to the second terminal of the first transistor, the first terminal of the fourth transistor, and the first terminal of the capacitor;

a fifth transistor having a first terminal and a control terminal, the control terminal of the fifth transistor coupled to the second terminal of the third resistor;

a sixth transistor having a first terminal and a control terminal, the control terminal of the sixth transistor coupled to the first terminal of the fifth transistor; and an inverter having a first terminal and a second terminal, the first terminal of the inverter coupled to the first terminal of the sixth transistor, the second terminal of the inverter coupled to the second terminal of the charge pump circuitry.

8. An apparatus comprising:

a first transistor having a first terminal and a control terminal;

a second transistor having a first terminal, a second terminal, and a control terminal, the first terminal of the second transistor coupled to the first terminal of the first transistor and the control terminal of the first transistor;

a first capacitor having a first terminal and a second terminal;

a second capacitor having a first terminal and a second terminal;

a third transistor having a first terminal, a second terminal, and a control terminal, the first terminal of the third transistor coupled to the second terminal of the second transistor, the first terminal of the first capacitor, and the first terminal of the second capacitor, and the control terminal of the third transistor;

a fourth transistor having a first terminal and a control terminal, the first terminal of the fourth transistor coupled to the second terminal of the third transistor;

a fifth transistor having a first terminal and a second terminal; and a sixth transistor having a first terminal and a second terminal, the first terminal of the sixth transistor coupled to the control terminal of the second transistor, the second terminal of the first capacitor, and the first terminal of the fifth transistor, the second terminal of the sixth transistor coupled to the second terminal of the second capacitor, the control terminal of the fourth transistor, and the second terminal of the fifth transistor.

9. The apparatus of claim 8, wherein the fourth transistor further has a second terminal, and the apparatus further comprising:

first current source circuitry having a first terminal and a second terminal, the first terminal of the first current source circuitry coupled to the first terminal of the first transistor and the first terminal of the second transistor, the second terminal of the first current source circuitry coupled to the control terminal of the second transistor, the second terminal of the first capacitor, the first terminal of the fifth transistor, and the first terminal of the sixth transistor; and second current source circuitry having a first terminal and a second terminal, the first terminal of the second current source circuitry coupled to the second terminal of the second capacitor, the control terminal of the fourth transistor, the second terminal of the fifth transistor, and the second terminal of the sixth transistor, the second terminal of the second current source circuitry coupled to the second terminal of the fourth transistor.

10. The apparatus of claim 8, wherein the fourth transistor further has a second terminal, the fifth transistor further has a control terminal, and the apparatus further comprising:

a seventh transistor having a first terminal, a second terminal, and a control terminal, the first terminal of the seventh transistor coupled to the first terminal of the first transistor and the first terminal of the second transistor, the second terminal of the seventh transistor coupled to the control terminal of the second transistor, the second terminal of the first capacitor, the first terminal of the fifth transistor, and the first terminal of the sixth transistor; and an eighth transistor having a first terminal, a second terminal, and a control terminal, the first terminal of the eighth transistor coupled to the second terminal of the second capacitor, the control terminal of the fourth transistor, the second terminal of the fifth transistor, and the second terminal of the sixth transistor, the second terminal of the eighth transistor coupled to the second terminal of the fourth transistor, the control terminal of the eighth transistor coupled to the control terminal of the fifth transistor and the control terminal of the seventh transistor.

11. The apparatus of claim 8, further comprising:

a first resistor having a first terminal and a second terminal;

clamp circuitry having a terminal;

a seventh transistor having a first terminal, a second terminal, and a control terminal, the first terminal of the seventh transistor coupled to the first terminal of the first transistor, the first terminal of the second transistor, and the first terminal of the first resistor, the control terminal of the seventh transistor coupled to the terminal of the clamp circuitry;

a second resistor having a first terminal and a second terminal, the first terminal of the second resistor coupled to the second terminal of the seventh transistor;

an inverter having a first terminal and a second terminal, the first terminal of the inverter coupled to the second terminal of the second resistor; and an eighth transistor having a first terminal and a control terminal, the first terminal of the eighth transistor coupled to the second terminal of the first resistor and the control terminal of the first transistor, the control terminal of the eighth transistor coupled to the second terminal of the inverter.

12. The apparatus of claim 11, wherein the fifth transistor further has a control terminal, the sixth transistor further has a control terminal, the inverter is a first inverter, and the apparatus further comprising a second inverter having a first terminal and a second terminal, the first terminal of the second inverter coupled to the second terminal of the first inverter, the control terminal of the sixth transistor, and the control terminal of the eighth transistor, the second terminal of the second inverter coupled to the control terminal of the fifth transistor.

13. The apparatus of claim 8, further comprising:

a first resistor having a first terminal and a second terminal;

charge pump circuitry having a first terminal and a second terminal, the first terminal of the charge pump circuitry coupled to the second terminal of the first resistor and the control terminal of the third transistor;

a second resistor having a first terminal and a second terminal, the first terminal of the second resistor coupled to the second terminal of the second transistor, the first terminal of the first capacitor, the first terminal of the second capacitor, the first terminal of the third transistor, and the first terminal of the first resistor;

a seventh transistor having a first terminal and a control terminal, the control terminal of the seventh transistor coupled to the second terminal of the second resistor;

an eighth transistor having a first terminal and a control terminal, the control terminal of the eighth transistor coupled to the first terminal of the seventh transistor; and an inverter having a first terminal and a second terminal, the first terminal of the inverter coupled to the first terminal of the eighth transistor, the second terminal of the inverter coupled to the second terminal of the charge pump circuitry.

14. The apparatus of claim 13, wherein the fifth transistor further has a control terminal, the sixth transistor further has a control terminal, the inverter is a first inverter, and the apparatus further comprising a second inverter having a first terminal and a second terminal, the first terminal of the second inverter coupled to the control terminal of the sixth transistor, the second terminal of the first inverter, and the second terminal of the charge pump circuitry, the second terminal of the second inverter coupled to the control terminal of the fifth transistor.

15. An apparatus comprising:

a first transistor having a first terminal and a control terminal;

a second transistor having a first terminal and a control terminal;

a first capacitor having a first terminal and a second terminal;

a second capacitor having a first terminal and a second terminal, the first terminal of the second capacitor coupled to the first terminal of the first transistor, the first terminal of the second transistor, and the first terminal of the first capacitor;

first current source circuitry having a terminal;

second current source circuitry having a terminal;

a third transistor having a first terminal and a second terminal;

a fourth transistor having a first terminal and a second terminal, the first terminal of the fourth transistor coupled to the control terminal of the first transistor, the second terminal of the first capacitor, the terminal of the first current source circuitry, and the first terminal of the third transistor, the second terminal of the fourth transistor coupled to the control terminal of the second transistor, the second terminal of the second capacitor, the terminal of the second current source circuitry, and the second terminal of the third transistor; and wherein the first and second transistors are configured to produce a shoot-through current during switching of the first and second transistors.

16. The apparatus of claim 15, wherein the first transistor further has a second terminal, the terminal of the first current source circuitry is a first terminal, the first current source circuitry further having a second terminal, the third transistor further has a control terminal, and the apparatus further comprising:

a Zener diode having a first terminal and a second terminal; and a fifth transistor having a first terminal, a second terminal, and a control terminal, the first terminal of the fifth transistor coupled to the second terminal of the first current source circuitry and the second terminal of the first transistor, and the first terminal of the Zener diode, the second terminal of the fifth transistor coupled to the control terminal of the first transistor, the second terminal of the first capacitor, the first terminal of the first current source circuitry, the first terminal of the third transistor, the first terminal of the fourth transistor, and the second terminal of the Zener diode, the control terminal of the fifth transistor coupled to the control terminal of the third transistor.

17. The apparatus of claim 15, wherein the second transistor further has a second terminal, the terminal of the second current source circuitry is a first terminal, the second current source circuitry further having a second terminal, the third transistor further has a control terminal, and the apparatus further comprising:

a Zener diode having a first terminal and a second terminal; and a fifth transistor having a first terminal, a second terminal, and a control terminal, the first terminal of the fifth transistor coupled to the second terminal of the second current source circuitry and the second terminal of the second transistor, and the first terminal of the Zener diode, the second terminal of the fifth transistor coupled to the control terminal of the second transistor, the second terminal of the second capacitor, the first terminal of the second current source circuitry, the second terminal of the third transistor, the second terminal of the fourth transistor, and the second terminal of the Zener diode, the control terminal of the fifth transistor coupled to the control terminal of the third transistor.

18. The apparatus of claim 15, wherein the first transistor further has a second terminal, the terminal of the first current source circuitry is a first terminal, the first current source circuitry further has a second terminal, and the apparatus further comprising:

a resistor having a first terminal and a second terminal;

a fifth transistor having a first terminal and a control terminal, the first terminal of the fifth transistor coupled to the second terminal of the first transistor, the second terminal of the first current source circuitry, and the first terminal of the resistor, the control terminal of the fifth transistor coupled to the second terminal of the resistor; and a sixth transistor having a first terminal and a second terminal, the first terminal of the sixth transistor coupled to the first terminal of the first transistor, the first terminal of the first capacitor, and the first terminal of the second capacitor, the second terminal of the sixth transistor coupled to the first terminal of the second transistor.

19. The apparatus of claim 18, wherein the resistor is a first resistor, further comprising:

clamp circuitry having a terminal;

a seventh transistor having a first terminal, a second terminal, and a control terminal, the first terminal of the seventh transistor coupled to the second terminal of the first transistor, the first terminal of the fifth transistor, and the first terminal of the first resistor, the control terminal of the seventh transistor coupled to the terminal of the clamp circuitry;

a second resistor having a first terminal and a second terminal, the first terminal of the second resistor coupled to the second terminal of the seventh transistor;

an inverter having a first terminal and a second terminal, the first terminal of the inverter coupled to the second terminal of the second resistor; and an eighth transistor having a first terminal and a control terminal, the first terminal of the eighth transistor coupled to the second terminal of the first resistor and the control terminal of the fifth transistor, the control terminal of the eighth transistor coupled to the second terminal of the inverter.

20. The apparatus of claim 18, wherein the resistor is a first resistor, and the apparatus is further comprising:

a second resistor having a first terminal and a second terminal;

charge pump circuitry having a first terminal and a second terminal, the first terminal of the charge pump circuitry coupled to the second terminal of the second resistor and the control terminal of the sixth transistor;

a third resistor having a first terminal and a second terminal, the first terminal of the third resistor coupled to the first terminal of the first transistor, the first terminal of the first capacitor, the first terminal of the second capacitor, the first terminal of the sixth transistor, and the first terminal of the second resistor;

a seventh transistor having a first terminal and a control terminal, the control terminal of the seventh transistor coupled to the second terminal of the third resistor;

an eighth transistor having a first terminal and a control terminal, the control terminal of the eighth transistor coupled to the first terminal of the seventh transistor; and an inverter having a first terminal and a second terminal, the first terminal of the inverter coupled to the first terminal of the eighth transistor, the second terminal of the inverter coupled to the second terminal of the charge pump circuitry.

21. The apparatus of claim 1, wherein the shoot-through current during switching of the first and second transistors is to reduce variation in a switching time of the first and second transistors.

* * * * *